(12) United States Patent
Lee et al.

(10) Patent No.: US 11,011,665 B2
(45) Date of Patent: May 18, 2021

(54) THIN FILM TRANSISTOR ARRAY SUBSTRATE FOR HIGH-RESOLUTION DIGITAL X-RAY DETECTOR AND HIGH-RESOLUTION DIGITAL X-RAY DETECTOR INCLUDING THE SAME

(71) Applicant: LG Display Co., Ltd., Seoul (KR)

(72) Inventors: Hanseok Lee, Goyang-si (KR); Hyeji Jeon, Changwon-si (KR)

(73) Assignee: LG Display Co., Ltd., Seoul (KR)

( * ) Notice: Subject to any disclaimer, the term of this patent is extended or adjusted under 35 U.S.C. 154(b) by 55 days.

(21) Appl. No.: 16/585,520

(22) Filed: Sep. 27, 2019

(65) Prior Publication Data

US 2020/0127154 A1     Apr. 23, 2020

(30) Foreign Application Priority Data

Oct. 18, 2018   (KR) ......................... 10-2018-0124614

(51) Int. Cl.

| | |
|---|---|
| *H01L 31/105* | (2006.01) |
| *H01L 31/0224* | (2006.01) |
| *H01L 31/115* | (2006.01) |
| *H01L 31/08* | (2006.01) |
| *H01L 27/146* | (2006.01) |
| *H01L 29/868* | (2006.01) |

(52) U.S. Cl.
CPC ...... *H01L 31/105* (2013.01); *H01L 27/14601* (2013.01); *H01L 27/14612* (2013.01); *H01L 27/14658* (2013.01); *H01L 27/14663* (2013.01); *H01L 29/868* (2013.01); *H01L 31/022483* (2013.01); *H01L 31/085* (2013.01); *H01L 31/115* (2013.01)

(58) Field of Classification Search
CPC ... H01L 31/105; H01L 31/115; H01L 31/085; H01L 29/868; H01L 27/14601; H01L 27/14663; H01L 27/14658; H01L 27/14612

See application file for complete search history.

(56) References Cited

U.S. PATENT DOCUMENTS

| | | | |
|---|---|---|---|
| 2019/0179039 A1* | 6/2019 | Kim .................. | H01L 27/14692 |
| 2019/0187305 A1* | 6/2019 | Yi ............................ | G01T 1/241 |
| 2020/0127014 A1* | 4/2020 | Lee .................... | H01L 27/14612 |

FOREIGN PATENT DOCUMENTS

KR    10-2016-0057516 A    5/2016

\* cited by examiner

*Primary Examiner* — Joseph C. Nicely
(74) *Attorney, Agent, or Firm* — Seed Intellectual Property Law Group LLP

(57) ABSTRACT

Disclosed are a thin-film transistor array substrate for a high-resolution digital X-ray detector and a high-resolution digital X-ray detector including the same in which a photosensitivity is improved by increasing a fill factor, and interference between PIN diodes is minimized, and step coverage of the PIN diode is improved to improve stability of the PIN diode. To those ends, an area of the PIN diode is maximized, and a pixel electrode of the PIN diode is disposed inside the PIN layer. Further, a clad layer made of inorganic material is formed in an edge region and/or a contact hole region of the pixel electrode. Thus, a leakage current resulting from concentrating an electric field on a curved region may be minimized.

22 Claims, 17 Drawing Sheets

THIN FILM TRANSISTOR ARRAY SUBSTRATE FOR HIGH-RESOLUTION DIGITAL X-RAY DETECTOR AND HIGH-RESOLUTION DIGITAL X-RAY DETECTOR INCLUDING THE SAME

CROSS-REFERENCE TO RELATED APPLICATION

This application claims the priority of Korean Patent Application No. 10-2018-0124614 filed on 18 Oct. 2018 in the Korean Intellectual Property Office, the disclosure of which is hereby incorporated by reference in its entirety.

BACKGROUND

Technical Field

The present disclosure relates to a thin-film transistor array substrate for a high-resolution digital X-ray detector, and to a high-resolution digital X-ray detector including the same.

Description of the Related Art

Because an X-ray is of a short wavelength, the X-ray can transmit through an object easily. The transmittance of an X-ray depends on an inner density of the object. Therefore, an internal structure of the object may be observed by detecting the transmittance of the X-ray as transmitted through the object.

One X-ray based inspection method used in a medical field is a film printing scheme. However, in the film printing scheme, in order to check a result, an image is shot, and then a film is printed. Thus, it takes a long time to check the result. Especially, in the film printing scheme, there are many difficulties in storing and preserving the printed film.

Recently, a digital X-ray detector (DXD) using a thin-film transistor has been developed and widely used in a medical field.

The digital X-ray detector detects the transmittance of the X-ray transmitted through the object and displays an internal state of the object on a display based on the transmittance.

Therefore, the digital X-ray detector may display the internal structure of the object without using a separate film and a printed paper. Further, the DXD has an advantage that the result may be checked in real time immediately after X-ray photographing.

As a demand for a high-resolution digital X-ray detector increases in recent years, there is a need for development of the high-resolution digital X-ray detector.

BRIEF SUMMARY

Embodiments of the present disclosure provide a thin-film transistor array substrate for a high-resolution digital X-ray detector in which a photo-sensitivity may be improved by increasing a fill factor and provide a high-resolution digital X-ray detector including the thin-film transistor array substrate.

Further embodiments of the present disclosure provide a thin-film transistor array substrate for a high-resolution digital X-ray detector in which interference that may occur between adjacent PIN diodes may be minimized, and provide a high-resolution digital X-ray detector including the thin-film transistor array substrate.

Furthermore, still further embodiments of the present disclosure provide a thin-film transistor array substrate for a high-resolution digital X-ray detector in which stability of a PIN diode may be improved by improving a step coverage of the PIN diode, and provide a high-resolution digital X-ray detector including the thin-film transistor array substrate.

Embodiments of the present disclosure are not limited to the above-mentioned embodiments. Other embodiments of the present disclosure, as not mentioned above, may be understood from the following descriptions and more clearly understood from the described embodiments of the present disclosure.

In one aspect of the present disclosure, there is proposed a thin-film transistor array substrate for a digital X-ray detector including: a thin-film transistor including an active layer, a gate electrode, and a first electrode and second electrode connected to the active layer; a first planarization layer on the thin-film transistor; and a PIN (P type semiconductor-Intrinsic type semiconductor-N type semiconductor) diode on the first planarization layer, the PIN diode including a third electrode connected to the thin-film transistor, a PIN layer and a fourth electrode on the PIN layer. The third electrode is inside the PIN layer and a clad layer made of inorganic material is between the third electrode and the PIN layer in an edge region of the third electrode to surround the edge region. Further, in one aspect of the present disclosure, there is proposed a digital X-ray detector including the thin-film transistor array substrate.

In this case, the clad layer may cover an inclined side surface or distal end of the third electrode. In this connection, the clad layer may covers by 3 μm or greater from a distal end or edge of a top surface of the third electrode along the top surface.

Further, in the thin-film transistor array substrate for the digital X-ray detector, and the digital X-ray detector including the same according to the present disclosure, the second electrode and the third electrode are connected to each other via a third contact hole formed in the first planarization layer, wherein the third contact hole is disposed inside the PIN diode and does not extend beyond the PIN diode, wherein the clad layer additionally covers a contact hole region of the third electrode corresponding to the third contact hole.

In this case, the clad layer is not formed on a planarized portion of the top surface of the third electrode. In this connection, the clad layer may be disposed inside the PIN diode. Alternatively, the clad layer may be disposed inside and outside the PIN diode. Alternatively, the clad layer may be connected to a clad layer of a PIN diode adjacent to the PIN diode.

According to the present disclosure, even when a size of the pixel is reduced to implement a high-resolution digital X-ray detector, a structure that maximizes an area of the PIN diode may be realized, thereby increasing a fill factor to improve a photo-sensitivity of the detector.

Further, according to the present disclosure, the third electrode, as a lower electrode of the PIN diode is positioned to extend along the PIN diode but not to extend beyond the PIN diode while maximizing the area of the PIN diode. Thus, a distance between adjacent third electrodes may be spaced a predetermined distance to minimize interference between adjacent PIN diodes.

Furthermore, according to the present disclosure, the clad layer made of inorganic material is present in the edge region or in the contact hole region and the edge region of the third electrode. This may improve a step coverage of the PIN diode, thus minimizing leakage current due to concentrating of the electric field onto a curved region, thereby to increase the stability of the PIN diode.

In addition to the above effects, specific effects of the present disclosure are described below in conjunction with descriptions of specific details to implement the present disclosure.

DETAILED DESCRIPTION

Figure 1:
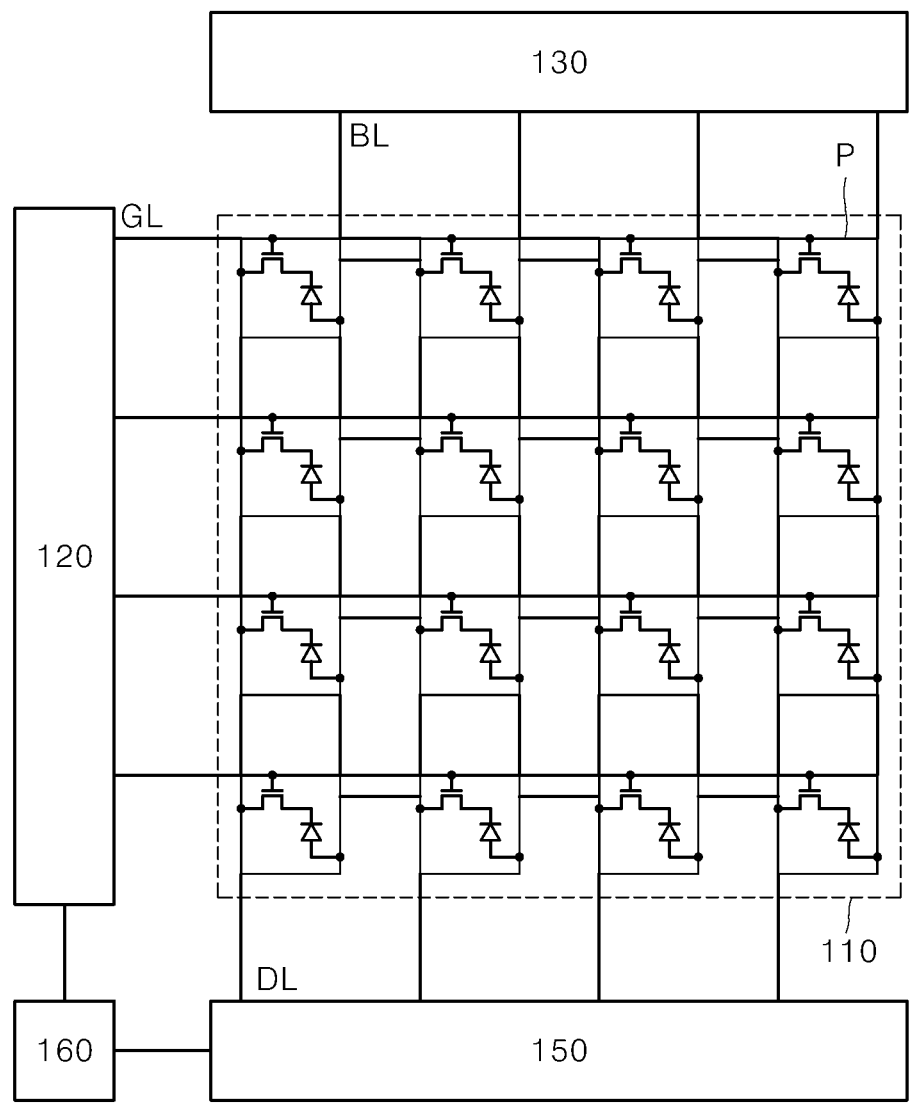
FIG. 1 is a block diagram for schematically illustrating a high-resolution digital X-ray detector.

For simplicity and clarity of illustration, elements in the figures are not necessarily drawn to scale. The same reference numbers in different figures denote the same or similar elements, and as such perform similar functionality. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a thin-film transistor array substrate for a high-resolution digital X-ray detector and a high-resolution digital X-ray detector including the thin-film transistor array substrate according to some embodiments of the present disclosure are described.

FIG. 1 is a block diagram for schematically describing the high-resolution digital X-ray detector. The high-resolution digital X-ray detector may include a thin-film transistor array 110, a gate driver 120, a bias supply 130, a readout circuitry 150, and a timing controller 160.

The thin-film transistor array 110 includes a plurality of cell regions defined by a plurality of gate lines GL arranged in a first direction and by a plurality of data lines DL arranged in a second direction orthogonal to the first direction. The cell regions are arranged in a matrix form. In each cell region, photo-sensitive pixels Ps may be formed. The thin-film transistor array 110 detects the X-ray emitted from an X-ray source and converts the detected X-ray into an electrical signal and outputs the electrical signal.

Each photo-sensitive pixel includes a PIN diode which converts light of a visible light region converted from the X-ray by a scintillator into an electronic signal and outputs the electronic signal, and a thin-film transistor TFT which transmits a detected signal output from the PIN diode to the readout circuitry 150. One end of the PIN diode may be connected to the thin-film transistor and the other end thereof may be connected to a bias line BL.

A gate electrode of the thin-film transistor may be connected to the gate line GL which carries a scan signal. Source/drain electrodes of the thin-film transistor may be respectively connected to the PIN diode and a data line DL which carries the detected signal output from the PIN diode. Each bias line BL may extend in a parallel manner to each data line DL.

The gate driver 120 may sequentially apply gate signals to thin-film transistors of photo-sensitive pixels through the gate lines GLs. The thin-film transistors of the photo-sensitive pixels may be turned on in response to the gate signals having a gate-on voltage level.

The bias supply 130 may apply driving voltages to the photo-sensitive pixels through the bias lines BL. The bias supply 130 may selectively apply a reverse bias or a forward bias to the PIN diode.

The readout circuitry 150 may read out the detected signal transmitted from the thin-film transistor turned on in response to the gate signal of the gate driver. That is, the detected signal output from the PIN diode may be input to the readout circuitry 150 through the thin-film transistor and the data line DL.

The readout circuitry 150 may read out the detected signal output from each of the photo-sensitive pixels during an offset readout period for reading out an offset image and an X-ray readout period for reading out the detected signal after an X-ray exposure.

The readout circuitry 150 may include a signal detector and a multiplexer. The signal detector includes a plurality of amplification circuits that correspond respectively to the data lines DL. Each amplification circuit may include an amplifier, a capacitor, and a reset element.

The timing controller 160 may generate an initiation signal and a clock signal and supply the initiation signal and the clock signal to the gate driver 120 to control an operation of the gate driver 120. Further, the timing controller 160 may generate a readout control signal and a readout clock signal, and may supply the readout control signal and the readout clock signal to the readout circuitry 150 to control an operation of the readout circuitry 150.

Figure 2:
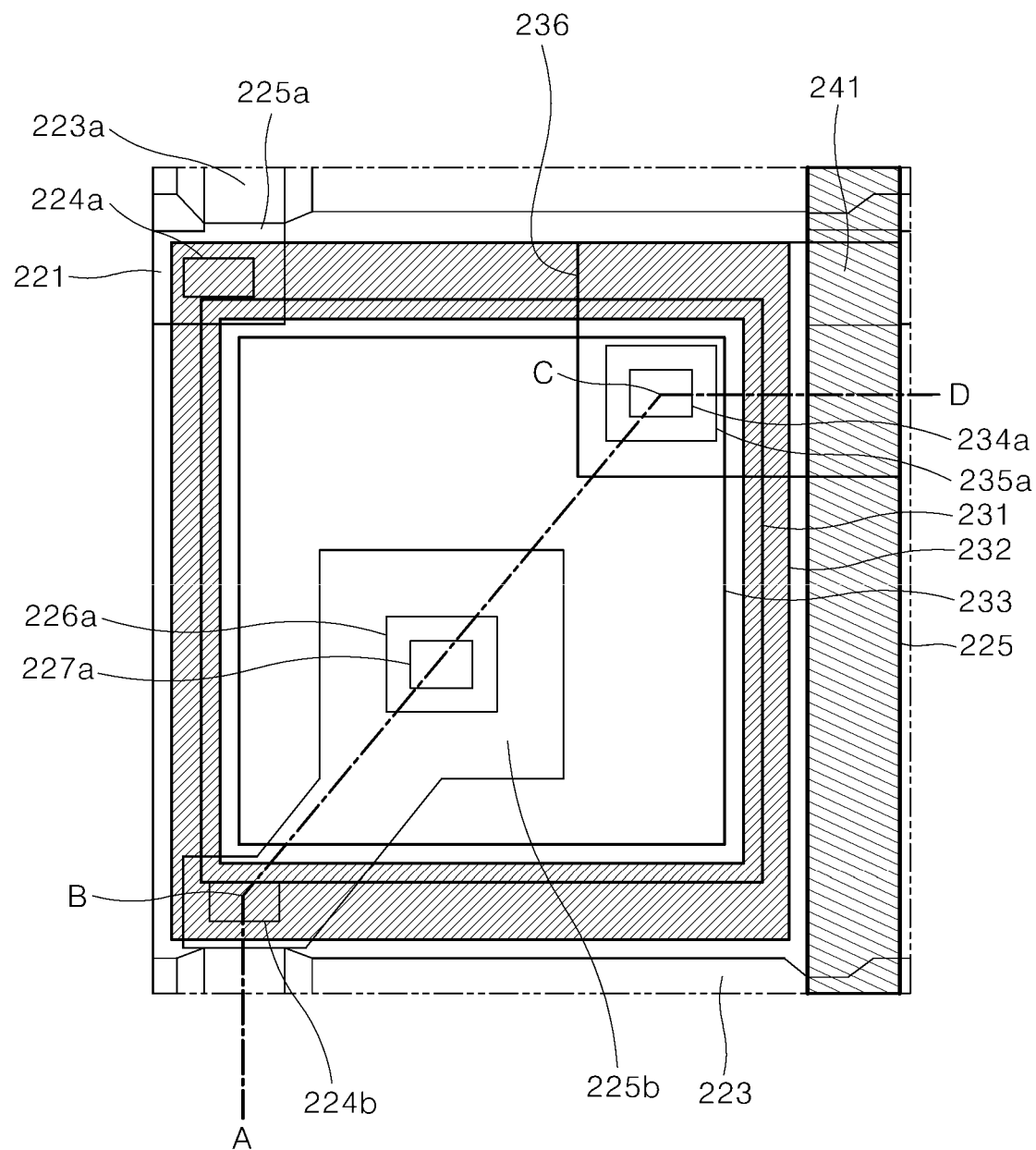
FIG. 2 is a top view of a partial region of a thin-film transistor array substrate for a high-resolution digital X-ray detector according to one embodiment of the present disclosure.
Figure 3:
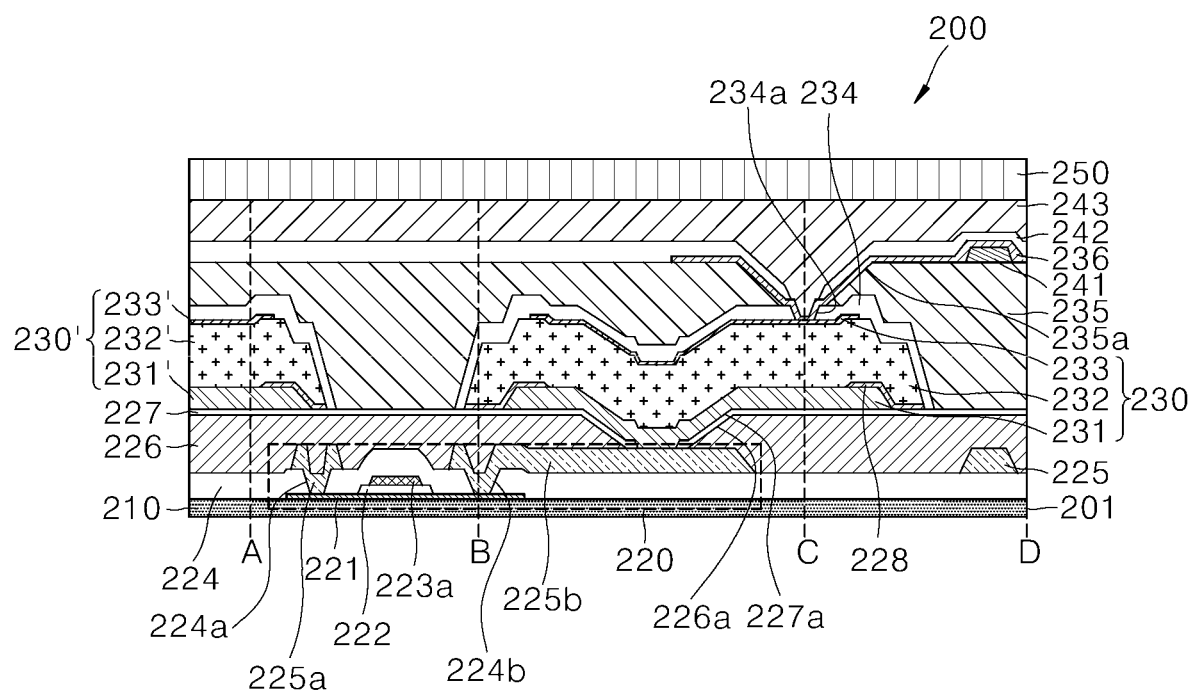
FIG. 3 is a cross-sectional view of a partial region of a thin-film transistor array substrate for a high-resolution digital X-ray detector according to one embodiment of the present disclosure.

FIG. 2 and FIG. 3 respectively show a top view and a cross-sectional view of a partial region of the TFT array substrate for the high-resolution digital X-ray detector according to one embodiment of the present disclosure.

The base substrate 210 may have a plurality of cell regions defined by the overlap or intersection between the gate lines 223 extending in one direction and the data lines 225 extending in another direction orthogonal to the extension of the gate lines 223. Each pixel P may correspond to each cell region. A plurality of pixels P may be defined.

Each thin-film transistor 220 and each PIN diode 230 may be disposed for each pixel. Thus, the plurality of thin-film transistors 220 and PIN diodes 230 may be formed on the array substrate 201. Hereinafter, description will be made based on each thin-film transistor 220 and each PIN diode 230 corresponding to one pixel. Unless otherwise specified, the description may be applied to an adjacent pixel.

The thin-film transistor 220 including an active layer 221, a gate electrode 223a, and a first electrode 225a and a second electrode 225b connected to the active layer 221 may be formed on a base substrate 210.

Between the base substrate 210 and the thin-film transistor 220, there may be a buffer layer made of an inorganic material such as silicon oxide $SiO_x$.

The active layer 221 may be made of an oxide semiconductor material which may include IGZO (InGaZnO)-based materials. The present disclosure is not limited thereto.

The gate electrode 223a may be formed on the active layer 221. A gate insulating layer 222 may be formed between the active layer 221 and the gate electrode 223a to electrically isolate the active layer 221 from the gate electrode 223a. That is, on the gate insulating layer 222, there may be formed the gate electrode 223a extending from the gate line 223 to correspond to a channel region of the active layer 221. The gate electrode 223a may be embodied as a single layer or multiple layers of conductive material.

The gate electrode 223a may extend from the gate line 223. The gate line 223 and the gate electrode 223a are monolithic so that the gate line 223 may be used as the gate electrode 223a. The gate line 223 and the gate electrode 223a may define the same layer. The gate line 223 and the gate electrode 223a may be formed in the same layer. Hereinafter, an example in which the gate line 223 is used as the gate electrode 223a as shown in FIG. 3 will be described.

The gate insulating layer 222 may be formed to correspond to the gate electrode 223a. However, the present disclosure is not limited thereto. The gate insulating layer 222 may be formed to have the same or larger area as that of the gate electrode 223a for effective insulation.

The gate electrode 223a and the gate insulating layer 222 may be formed on a middle region of the active layer 221. Therefore, a source region and a drain region may be respectively formed as both end regions of the active layer 221 other than the channel region of the active layer 221, where the both end regions are not covered by the gate electrode 223a and are exposed.

The source region and the drain region of the active layer 221 may be respectively formed by converting the both end regions of the active layer 221 to conductive regions. The both end regions of the active layer 221 may be converted to the conductive regions via various methods such as a dry etching method, a hydrogen plasma treatment, a helium plasma treatment and the like.

The source region of the active layer 221 may be disposed closer to the PIN diode 230 than the drain region thereof may be. However, the present disclosure is not limited thereto. The drain region of the active layer 221 may be disposed closer to the PIN diode 230 than the source region thereof may be.

Further, the active layer 221 may be formed of amorphous silicon (a-Si) other than the oxide semiconductor material. The material used for forming the active layer 221 is not particularly limited.

An inter-layer insulating layer 224 may be formed on the gate electrode 223a to cover the base substrate 210. On the inter-layer insulating layer 224, the first electrode 225a and the second electrode 225b may be formed.

The first electrode 225a and the second electrode 225b may be respectively formed to overlap the both end regions of the active layer 221, such that the gate electrode 223a is horizontally interposed between the first electrode 225a and the second electrode 225b. A first contact hole 224a and a second contact hole 224b may be formed in the inter-layer insulating layer 224 such that the first contact hole 224a and second contact hole 224b are vertically interposed between one end region of the active layer 221 and the first electrode 225a and between the other end region of the active layer 221 and the second electrode 225b, respectively.

Specifically, the first contact hole 224a may be formed to correspond to the drain region of the active layer 221, while the second contact hole 224b may be formed to correspond to the source region of the active layer 221. Accordingly, the first electrode 225a may be connected to the drain region of the active layer 221 via the first contact hole 224a, while the second electrode 225b may be connected to the source region of the active layer 221 via the second contact hole 224b.

The first electrode 225a and the second electrode 225b may extend from the data line 225. The first electrode 225a and the second electrode 225b and the data line 225 may define the same layer. In one embodiment, the first electrode 225a may act as a drain electrode, while the second electrode 225b may act as a source electrode.

A first planarization layer 226 made of an inorganic material may be formed on the thin-film transistor 220. The first planarization layer 226 may cover the first electrode 225a and the second electrode 225b.

The first planarization layer 226 may be formed of a layer of organic material, which is much thicker than an inorganic layer. Thus, parasitic capacitance that may occur between electrodes or interconnects sandwiching the first planarization layer 226 therebetween may be minimized.

Further, the first planarization layer 226 may have a planarized top face regardless of a shape of the underlying electrode or elements, thereby to minimize a curved portion. This may enhance stability of an element such as the PIN diode 230, which may be formed on the first planarization layer 226.

The planarization layer 226 may be made of an organic material such as an acrylic resin such as photo acryl (PAC). However, the present disclosure is not limited thereto. A material such as PR (photo resist) may be used for the planarization layer 226.

On the first planarization layer 226, a first protective layer 227 may be formed, which is an inorganic layer made of an inorganic material. The first protective layer 227 protects the underlying thin-film transistor 220, particularly the active layer 221.

In a case where the active layer 221 is made of an oxide semiconductor material, the first protective layer 227 may include silicon oxide, but may be free of silicon nitride. Silicon nitride has a high moisture content. Thus, if the first protective layer 227 includes silicon nitride, the moisture may invade the active layer 221 made of an oxide semiconductor beneath the first protective layer 227, and, thus, the active layer 221 may become conductive, thereby damaging the active layer 221.

However, when the active layer 221 is made of an amorphous silicon material, the active layer 221 may not be sensitive to the moisture. Thus, the first protective layer 227 may include silicon nitride as well as silicon oxide to further enhance the protective performance.

Further, the first protective layer 227 made of an inorganic material may further facilitate the adhesion between organic planarization layers.

The PIN diode 230 may be formed on the first planarization layer 226. Each PIN diode 230 may be disposed in each cell region. The PIN diode 230 may include a third electrode 231 connected to the thin-film transistor 220, a PIN layer 232 on the third electrode 231, and a fourth electrode 233 on the PIN layer 232.

The third electrode 231 may serve as a pixel electrode as a lower electrode in the PIN diode 230. The third electrode 231 may be made of an opaque metal such as molybdenum (Mo) or a transparent oxide such as ITO (Indium Tin Oxide), IZO (Indium Zinc Oxide) or ZnO (Zinc Oxide) depending on characteristics of the PIN diode.

The third electrode 231 may be connected to the second electrode 225b of the thin-film transistor 220 via a third contact hole 226a in the first planarization layer 226. When there is the first protective layer 227 between the first planarization layer 226 and the third electrode 231, the first protective layer 227 may have a fourth contact hole 227a defined therein. The fourth contact hole 227a may be formed at the same position as the third contact hole 226a, and may be located inwardly of the third contact hole 226a. Therefore, a size of the fourth contact hole 227a may be smaller than that of the third contact hole 226a.

Thus, in the presence of the first protective layer 227, the third electrode 231 may be connected to the second electrode 225b of the thin-film transistor 220 via the first third contact hole 226a and the fourth contact hole 227a.

A PIN layer 232 may be formed on the third electrode 231 to convert visible light converted from an X-ray via a scintillator into an electric signal. The PIN layer 232 may be formed by sequentially stacking an N (negative) type semiconductor layer including an N type impurity, a I (intrinsic type) semiconductor layer not including an impurity, and a P (positive) type semiconductor layer including a P type impurity.

The I-type semiconductor layer may be relatively thicker than the N-type semiconductor layer and the P-type semiconductor layer. The PIN layer 232 contains a material capable of converting visible light from the scintillator into an electrical signal. For example, the material capable of converting visible light from the scintillator into the electrical signal may include a-Se, $HgI_2$, CdTe, PbO, $PbI_2$, $BiI_3$, GaAs, and Ge.

The fourth electrode 233 may be formed as an upper electrode on the PIN layer 232. The fourth electrode 233 may be made of at least one of transparent oxides such as ITO (Indium Tin Oxide), IZO (Indium Zinc Oxide), and ZnO (Zinc Oxide) to improve a fill factor of the PIN diode 230.

In the high resolution digital X-ray detector, as a resolution thereof increases, more pixels are needed. However, in a case where the resolution increases in a state where a total area in which the pixels may be formed is fixed, as a size of a cell region corresponding to one pixel decreases, a size of each pixel decreases.

As a result, a size of the PIN diode 230 included in each pixel is reduced. As a result, the fill factor of the PIN diode 230 is reduced. As a result, a photo-sensitivity of the digital X-ray detector may deteriorate.

The fill factor refers to a ratio of a light receiving area to a single pixel area in the X-ray detector. In other words, the fill factor may be defined as a ratio of an area of the PIN diode 230 to a single pixel area.

Therefore, as the fill factor decreases, and even when the same amount of visible light is irradiated to the PIN diode, an amount of an electric signal as converted also decreases due to the reduction of the light receiving area, such that overall performance of the X-ray detector may be degraded.

The degradation of the photo-sensitivity of the digital X-ray detector may eventually lead to the performance degradation of the digital X-ray detector.

Therefore, it is desirable to maximize the area of the PIN diode 230 to improve the fill factor in order to prevent the photo-sensitivity degradation of the high-resolution digital X-ray detector.

Accordingly, in accordance with the present disclosure, the present invention attempts to increase the fill factor of the PIN diode 230 by making the PIN diode 230 included in one pixel as wide as possible. For this purpose, the PIN diode 230, specifically, the PIN layer 232 may be formed over the entire surface of the cell region corresponding to one pixel. That is, the PIN diode 230 may be formed over the entire surface of the cell region except for the gate line 223 and the data line 225.

As described above, the cell regions may be defined by the intersection between the plurality of gate lines 223 and the plurality of data lines 225. Thus, the gate line 223 and the data line 225 may act as boundaries between adjacent cell regions.

In one example, the area of the PIN diode 230 may be increased by arranging the second electrode 225b of the thin-film transistor 220 and the PIN diode 230 so that the second electrode 225b of the thin-film transistor 220 is located below the PIN diode 230 and overlaps with the PIN diode 230. In this case, not only the second electrode 225b but also the second contact hole 224b may be disposed inside the PIN diode 230, so that the PIN diode 230 may have a wider area. In other words, not only the second electrode 225b but also the second contact hole 224b may vertically overlap and may be located below the PIN diode 230.

Further, the first contact hole 224a of the thin-film transistor 220 may be located below and may vertically overlap another PIN diode 230' adjacent to the PIN diode 230 overlapping the second contact hole 224b. As the total area of the PIN diodes 230 increases across the plurality of pixel regions, the total fill factor of the PIN diodes 230 may be increased.

As the second electrode 225b of the thin-film transistor 220 is disposed inside the PIN diode 230, the second electrode 225b may be positioned to overlap with the third electrode 231 of the PIN diode 230. Further, the third contact hole 226a formed in the first planarization layer 226 may be located inside the PIN diode 230.

That is, the second electrode 225b, the second contact hole 224b, and the third contact hole 226a of the thin-film transistor 220 are overlapped with the PIN diode 230. Thus, the PIN diode 230 may extend up to a region where the second electrode 225b, the second contact hole 224b and the third contact hole 226a are formed. Consequently, the light receiving area increases, such that the fill factor of the PIN diode 230 may be increased.

However, since the second electrode 225b and the third electrode 231 are overlapped with each other, parasitic capacitance may be generated between the second electrode 225b and the third electrode 231. Thus, in accordance with the present disclosure, the generation of parasitic capacitance may be minimized by forming the first planarization layer 226 made of organic material between the second electrode 225b and the third electrode 231.

Since the first planarization layer 226 is made of organic material, the first planarization layer 226 may be thicker than the layer made of the inorganic material. Thus, a distance between the second and third electrodes can be maximized. Therefore, when the second electrode 225b and the third electrode 231 are overlapped with each other, as in the present disclosure, the generation of the parasitic capacitance may be minimized by the first planarization layer 266.

Further, the third electrode 231 included in the PIN diode 230 may be disposed below and inside the PIN layer 232. That is, the PIN layer 232 may completely cover the third electrode 231 so that an entirety of the third electrode 231 is located below the PIN layer 232 and is screened by the PIN layer 232.

As the area of the PIN diode 230 is increased to increase the fill factor, a distance between the corresponding PIN diode 230 and a PIN diode 230' adjacent thereto becomes smaller. Accordingly, the distance between the third electrode 231 of the corresponding PIN diode 230 and another third electrode 231' of the adjacent PIN diode 230' may be smaller. Thus, the PIN diode 230 may experience interference in which the PIN diode 230 may be affected by the third electrode 231' of the adjacent PIN diode 230'. Further, there may be a problem that a horizontal parasitic capacitance may be generated between the third electrodes 231 and 231' which are close to each other.

That is, when the third electrode 231 of the PIN diode 230 is wider than the PIN layer 232 and thus the third electrode 231 extends beyond the PIN layer 232, the distance between the adjacent third electrodes 231 and 231' becomes smaller, such the above problem, that is, the horizontal parasitic capacitance may arise.

Accordingly, in accordance with the present disclosure, the PIN layer 232 covers the entirety of the third electrode 231 such that the third electrode 231 does not extend beyond the PIN layer 232. Thus, the adjacent third electrodes 231 and 231' may be spaced by a predetermined distance, thereby to minimize the interference phenomenon. In other words, the configuration in accordance with the present disclosure increases the area of the PIN diode 230 to increase the fill factor, so that even when the distance between the adjacent PIN diodes 230 and 230' is smaller, the interference phenomenon or parasitic capacitance between the PIN diodes 230 and 230' may be minimized.

According to the present disclosure, the third electrode 231 of the PIN diode 230 is located below the PIN layer 232 of the PIN diode 230 and does not extend beyond the PIN layer 232. Thus, each of the edges or distal ends of the third electrode 231 does not extend beyond the PIN layer 232.

In a case where the third electrode 231 made of metal is formed on the first planarization layer 226 or the first protective layer 227, each of the distal ends of the third electrode 231 may be tapered to form an inclined side surface. Alternatively, each of the distal ends of the third electrode 231 may not have the inclined side surface of a certain shape, and may have the side surface of an irregular shape depending on an electrode forming process.

In forming the PIN layer 232 on the third electrode 231, first, a thin N-type semiconductor layer is formed on the third electrode 231. In this case, the N-type semiconductor layer is uniformly formed on the planarized surface of the third electrode 231. However, the N-type semiconductor layer may not be uniformly formed on the surface on a region where the surface is not planarized, such as the distal end of the third electrode 231.

For example, when the side surface of the distal end of the third electrode 231 has a forward taper shape, the N type semiconductor layer may not be uniformly formed on the inclined side surface compared to the planarized top surface of the third electrode 231, resulting in a local region in which the N type semiconductor layer is not locally formed.

Moreover, the side surface of the distal end of the third electrode 231 has a reverse tapered shape, the N-type semiconductor layer cannot be formed along the entire surface of the third electrode 231. Thus, the N type semiconductor layer may not be continuously formed on the side surface having the reverse tapered shape and may be disconnected at the side surface.

Further, when the side surface of the distal end of the third electrode 231 has an irregular shape, the N type semiconductor layer may not be uniformly formed thereon, and thus the N type semiconductor layer may not be locally formed.

As a result, when the third electrode 231 is located inside the PIN layer 232 such that the distal end of the third electrode 231 does not extend beyond the PIN layer 232, the PIN layer 232 may be formed on the distal end of the third electrode 231 whose surface is not planarized, thereby to degrade a step coverage of the PIN diode 230.

When the step coverage of the PIN layer 232 is decreased, a leakage current may increase in a region having the decreased step coverage, thereby to degrade the stability of the PIN diode 230.

Therefore, in accordance with the present disclosure, a clad layer 228 made of inorganic material may cover an edge region, that is, the edge or distal end of the third electrode 231 so as to improve the step coverage of the PIN layer 232. The clad layer 228 is formed to surround the edge region of the third electrode 231. Thus, the N type semiconductor layer may be uniformly formed not only on the planarized top surface of the third electrode 231 but also on the clad layer 228 formed on the edge region of the third electrode 231.

The clad layer 228 may be formed to cover not only the side surface of the distal end or edge of the third electrode 231 but also a portion of the top surface of the third electrode 231.

Specifically, the clad layer 228 is formed to cover the inclined side surface of the third electrode 231. The clad layer 228 may be formed on the third electrode 231 so as to cover a portion of the top surface of the third electrode 231 extending by 3 µm or greater from the edge or distal end of the third electrode 231. When the clad layer 228 is formed to cover a portion of the top surface of the third electrode 231 extending by a distance smaller than 3 µm from the distal end of the third electrode 231, the step coverage of the PIN layer 232 may not be improved in a considerable degree. Thus, it may be difficult to obtain a reduction effect of the leakage current at the edge region.

Since the third electrode 231 requires an area in which the third electrode 231 can be in direct contact with the PIN layer 232, the clad layer 228 is formed along the edge region of the third electrode 231 so as to cover the edge region. Thus, the third electrode 231 has a ring shape having a hollow portion in which the clad layer 228 is not formed.

As the step coverage of the PIN layer 232 is improved due to the clad layer 228 formed in the edge region of the third electrode 231, it is possible to minimize the occurrence of the leakage current in the edge region of the third electrode 231.

In one embodiment according to the present disclosure, in order to maximize the area of the PIN diode 230 and at the same time, minimize the generation of parasitic capacitance, the first planarization layer 226 made of organic material is formed beneath the PIN diode 230 and the third contact hole 226a formed in the first planarization layer 226 may be positioned blow and overlap with and does not extend beyond the PIN diode 230.

Therefore, the third electrode 231 formed on the first planarization layer 226 or the first protective layer 227 may be curved in the region of the third contact hole 226a. In particular, since the first planarization layer 226 is formed of an organic material layer which may be thicker than the inorganic material layer, the third contact hole 226a may be formed to be deeper and thus the bending degree may be larger in the curved region.

That is, when the third electrode 231 located under the PIN layer 232 is formed along the third contact hole 226a, the third electrode 231 is bent in the contact hole region. In this connection, when the PIN layer 232 is formed on the third electrode 231, the step coverage of the PIN layer 232 in the contact hole region may be degraded.

Accordingly, the N-type semiconductor layer of the PIN layer 232 may not be uniformly formed in the contact hole region of the third electrode 231. Thus, an electric field in the PIN diode 230 may concentrate on the contact hole region of the bent third electrode 231, thereby to cause a leakage current to increase in the contact hole region.

Figure 4:
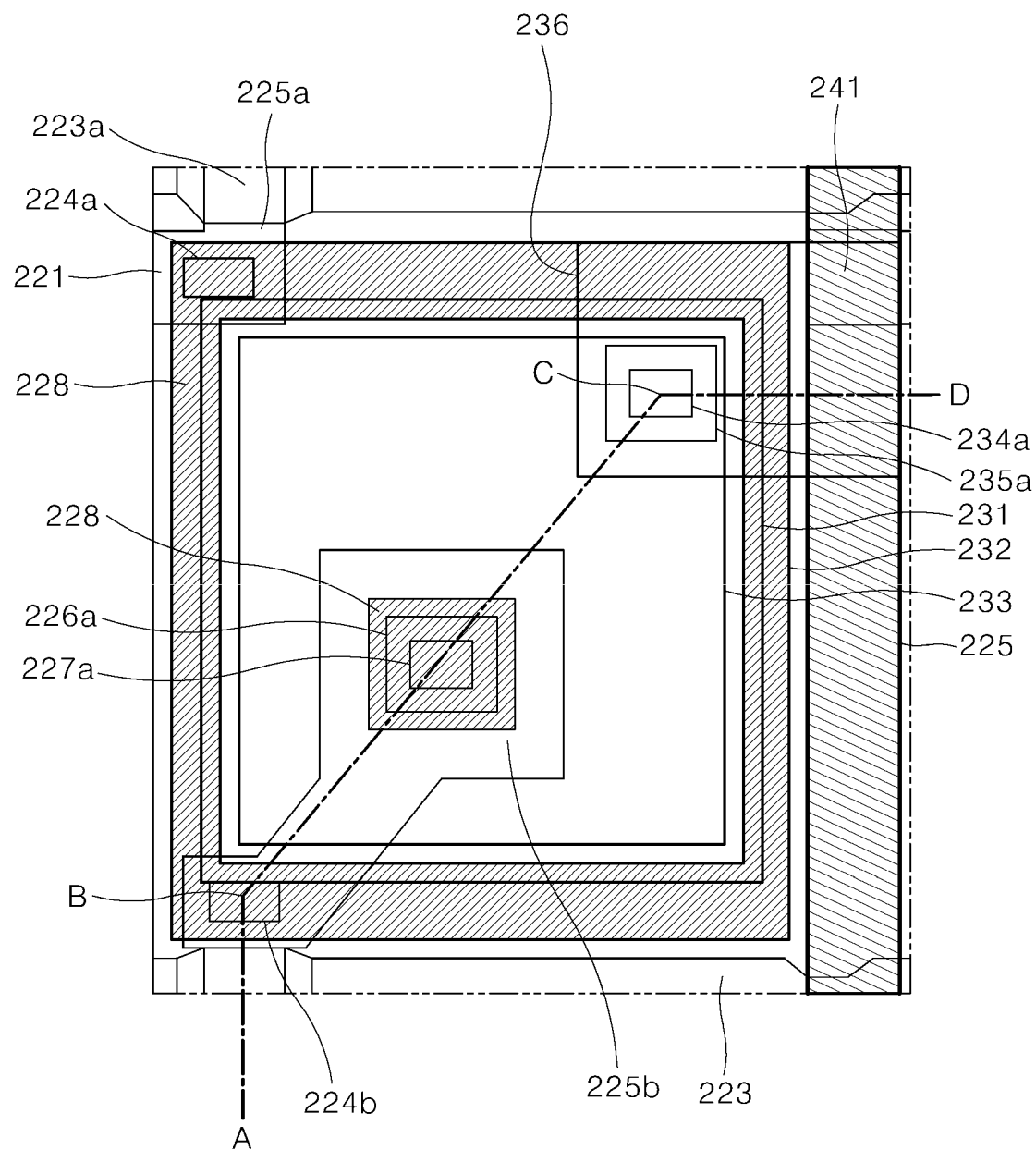
FIG. 4 is a top view of a partial region of a thin-film transistor array substrate for a high-resolution digital X-ray detector according to another embodiment of the present disclosure.
Figure 5:
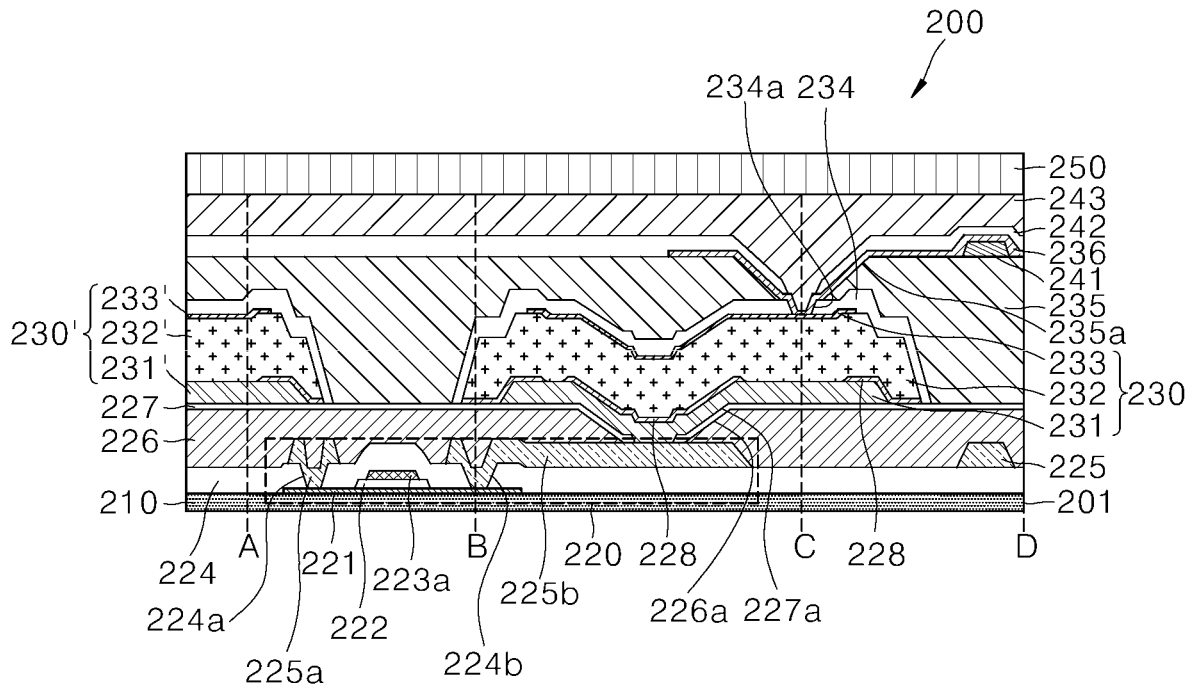
FIG. 5 is a cross-sectional view of a partial region of a thin-film transistor array substrate for a high-resolution digital X-ray detector according to another embodiment of the present disclosure.

Accordingly, according to the present disclosure, as shown in FIG. 4 and FIG. 5, the contact hole region of the third electrode 231 overlying or corresponding to the third contact hole 226a of the first planarization layer 226 is additionally covered with the clad layer 228 made of an inorganic material. Thus, the leakage current may be reduced by improving the step coverage of the PIN layer 232 and allowing the concentration of the electric field into the contact hole region to be reduced.

The clad layer 228 is formed along the edge region and additionally covers the contact hole region. The planarized region of the top surface of the third electrode 231 is not covered with the clad layer 228 such that the third electrode 231 and the PIN layer 232 contact each other.

The clad layer 228 may be implemented in various embodiments in terms of a layout. For example, the clad layer 228 may extend inside the PIN diode 230 as shown in FIG. 3 and FIG. 5. That is, the clad layer 228 may be formed to cover the edge region of the third electrode 231, and may be formed to be located below and inside the PIN layer 232.

Specifically, a configuration that the clad layer 228 is disposed below and does not extend beyond the PIN layer 232 may include not only a configuration that an outer edge of the clad layer 228 does not coincide with an outer edge of the PIN layer 232 but also a configuration that an outer edge of the clad layer 228 coincides with an outer edge of the PIN layer 232. When the clad layer 228 is disposed inside the PIN layer 232, the clad layer 228 may be made of an inorganic material such as silicon oxide or silicon nitride.

Figure 6:
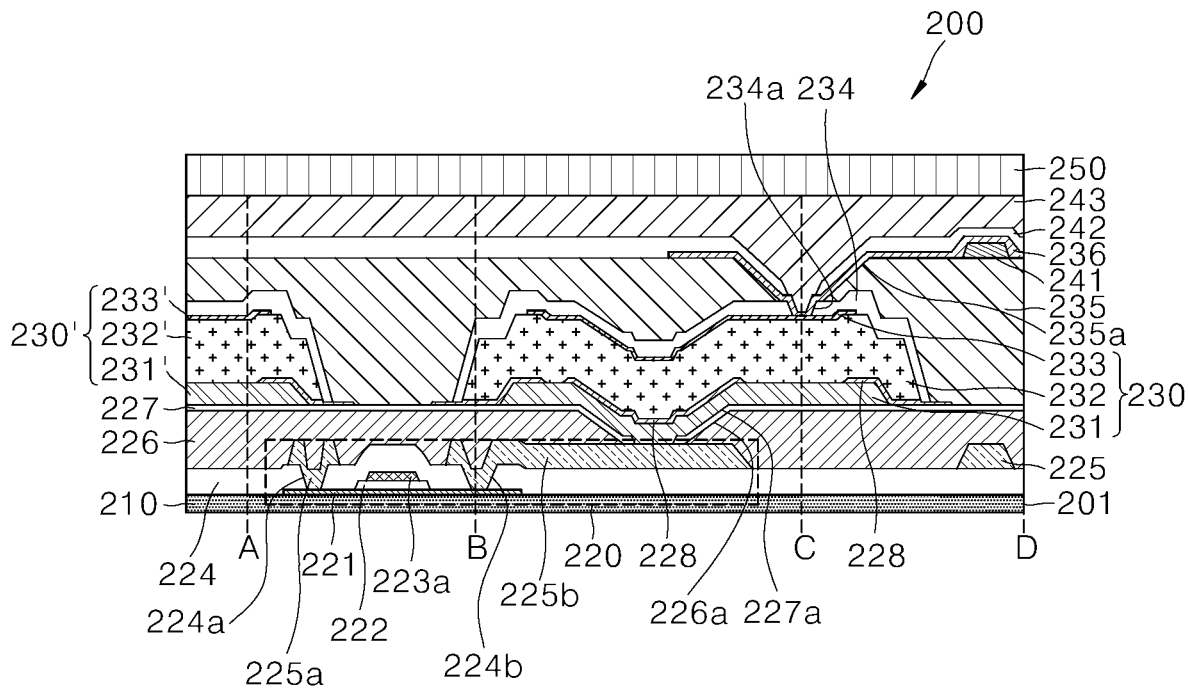
FIG. 6 is a cross-sectional view of a partial region of a thin-film transistor array substrate for a high-resolution digital X-ray detector according to still another embodiment of the present disclosure.

Further, the clad layer 228 may extend inside and outside the PIN diode 230 as shown in FIG. 6. That is, the clad layer 228 may be formed to cover the edge region of the third electrode 231, and may extend along the PIN layer 232 and partially extend to non-overlap the PIN layer 232.

In this connection, a partial region of the clad layer 228 non-overlapping the PIN layer 232 may extend to a location in which the clad layer 228 does not overlap the active layer of the thin-film transistor. Accordingly, when the clad layer 228 extends along the PIN layer 232 and partially extends to non-overlap the PIN layer 232 to the location in which the clad layer 228 does not overlap the active layer of the thin-film transistor, the clad layer 228 may be made of an inorganic material such as silicon oxide or silicon nitride.

A portion of the clad layer 228 non-overlapping the PIN layer 232 may be thinner than a portion of the clad layer 228 inside the PIN diode 230. Since the portion of the clad layer 228 outside the PIN diode 230 is exposed outside the PIN diode, the exposed portion of the clad layer 228 outside the PIN diode 230 may be subjected to an etching process applied to the PIN diode 230 disposed thereon, such that a thickness of the exposed portion of the clad layer 228 may be smaller.

Figure 7:
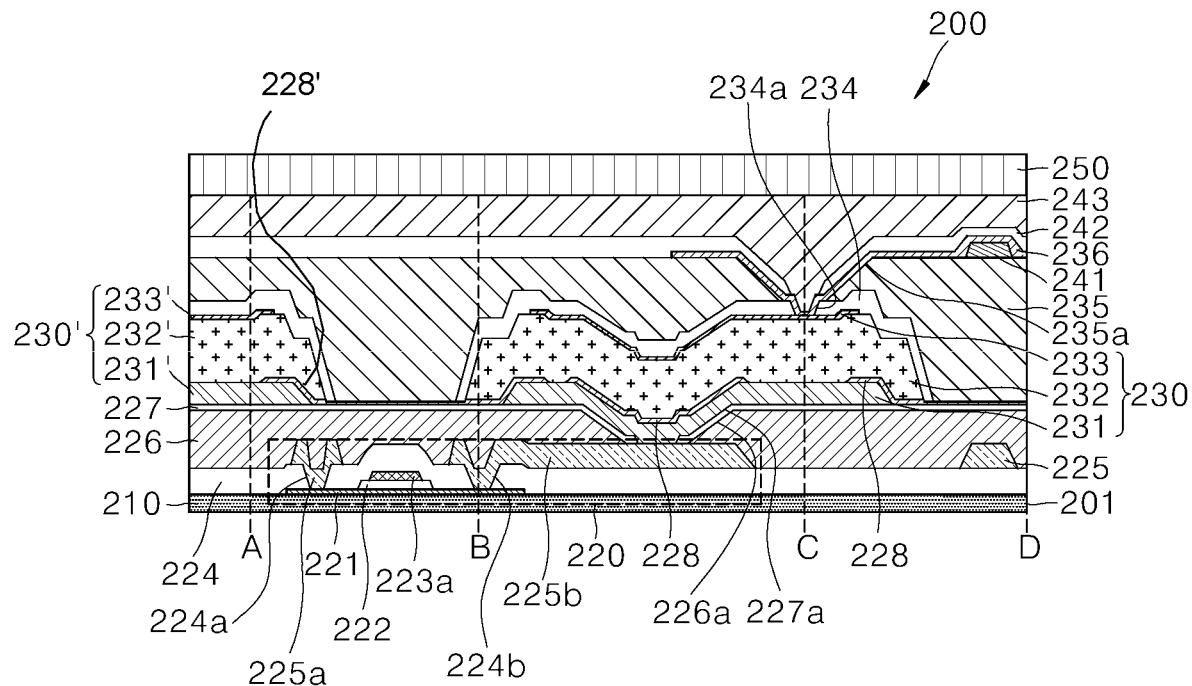
FIG. 7 is a cross-sectional view of a partial region of a thin-film transistor array substrate for a high-resolution digital X-ray detector according to yet still another embodiment of the present disclosure.

Further, the clad layer 228 may be formed to be connected to a clad layer 228' in an adjacent pixel as shown in FIG. 7. That is, the clad layer 228 may be formed so as to cover the edge region of the third electrode 231, and may extend along the PIN layer 232 and may be formed to be connected to the clad layer 228' of the adjacent pixel, thereby to cover the thin-film transistor.

Thus, the clad layer 228 may be formed to cover the entire surface of the base substrate except for the planarized top surface of the third electrode 231 where the third electrode 231 contacts the PIN layer 232. In this case, the clad layer 228 may be made of an inorganic material such as silicon oxide or silicon nitride. However, since the clad layer 228 is formed to overlap with the active layer of the thin-film transistor, the material of the clad layer 228 may be selected depending on the type of thin-film transistor.

For example, when the active layer 221 of the thin-film transistor 220 is formed of an oxide semiconductor material, the clad layer 228 is preferably made of silicon oxide. This is because silicon nitride contains a large amount of moisture, and, thus, when the clad layer 228 made of the silicon nitride is formed on the thin-film transistor 220, moisture may invade the active layer 221 such that the active layer 221 may become conductive, thereby to damage the active layer 221.

However, when the active layer 221 of the thin-film transistor 220 is made of an amorphous silicon material, the active layer 221 may not be sensitive to the effect of the moisture. In this case, the clad layer 228 may be made of an inorganic material such as silicon nitride as well as silicon oxide.

In this case, an outer portion of the clad layer 228 non-overlapping the PIN layer 232, that is, the PIN diode 230 may be thinner than an inner portion of the clad layer 228 overlapping the PIN layer 232. Since the portion of the clad layer 228 outside the PIN diode 230 is exposed to an outside to the PIN diode, the exposed portion of the clad layer 228 outside the PIN diode 230 may be subjected to an etching process applied to the PIN diode 230 disposed thereon, such that a thickness of the exposed portion of the clad layer 228 may be smaller.

In addition, when the clad layer 228 is formed to be connected to a clad layer 228' of an adjacent pixel, the clad layer 228 may act as the first protective layer 227, such that the first protective layer 227 may be omitted. That is, when the clad layer 228 and the first protective layer 227 is formed of the same inorganic layer and the clad layer 228 is formed to cover the entire surface of the base substrate, the clad layer 228 may serve as the first protective layer 227. Accordingly, when the clad layer 228 serves as the first protective layer 227 such that the first protective layer 227 is omitted, a separate process for forming the first protective layer 227 may be omitted, thereby achieving a process efficiency.

Thus, the clad layer 228 according to the present disclosure is formed between the third electrode 231 and the PIN layer 232 to cover the edge region and/or the contact hole region of the third electrode 231, such that the step coverage of the PIN layer 232 may be improved.

In the embodiment of the present disclosure having a structure for maximizing the area of the PIN diode 230 for high resolution implementation, the contact hole of the first planarization layer 226 is disposed below and vertically overlaps with the PIN diode 230, the curved portion is formed, such that the leakage current may increase in the curved region.

Thus, when the clad layer 228 is covered on the curved region of the third electrode 231 as in the present disclosure, it is possible to improve the step coverage of the PIN diode 230 and to minimize the leakage current that may occur in the curved portion.

That is, according to the present disclosure, the enhanced step coverage of the PIN layer 232 may lead to minimizing the leakage current occurring due to concentration of the electric field on the partial region, thereby increasing the stability of the PIN diode 230.

A second protective layer 234 may be formed on the PIN diode 230. The second protective layer 234 may protect the PIN diode 230 from moisture and may be made of an inorganic material. Specifically, the second protective layer 234 may include silicon oxide $SiO_x$ or silicon nitride $SiN_x$. In particular, the silicon nitride may act as an effective barrier against penetration of moisture into the PIN diode 230.

However, when the active layer 221 of the thin-film transistor 220 is formed of an oxidized semiconductor material, the second protective layer 234 is preferably patterned to cover only the PIN diode 230 as shown in FIG. 3. This is because silicon nitride contains a large amount of moisture, and, thus, when the second protective layer 234 made of the silicon nitride is formed on the thin-film transistor 220, moisture may invade the active layer 221 such that the active layer 221 may become conductive, thereby to damage the active layer 221.

However, when the active layer 221 of the thin-film transistor 220 is made of an amorphous silicon material, the active layer 221 of the thin-film transistor 220 may not be sensitive to the effect of the moisture. Thus, as shown in FIG. 8, the second protective layer 234 covers the entire surface of the base substrate 210 to cover not only the PIN diode 230 but also the thin film transistor 220, thereby further enhancing the protective performance.

Figure 8:
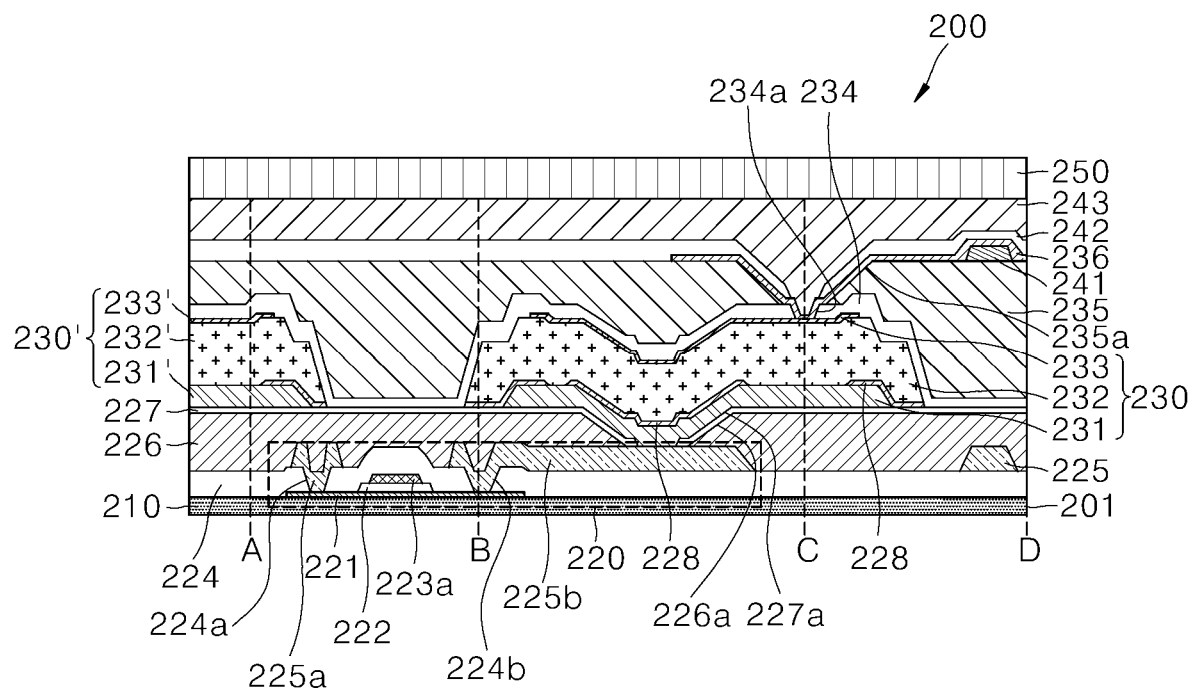
FIG. 8 is a cross-sectional view of a partial region of a thin-film transistor array substrate for a high-resolution digital X-ray detector according to further yet still another embodiment of the present disclosure.

In an example of FIG. 8, a separate patterning process of the second protective layer 234 may be omitted to obtain a manufacturing process efficiency. The PIN diode 230 as well as the thin-film transistor 220 may be additionally protected by the second protective layer 234, thereby to further enhance the stability of the digital X-ray detector.

The configuration that the second protective layer 234 covers the entire surface of the base substrate 210 may be applied not only to the example of FIG. 8 where the clad layer 228 overlaps with the PIN layer 232, but also to the example of FIG. 6 where the clad layer 228 extends along the PIN layer 232, and out of the PIN layer 232, and the example of FIG. 7 where the clad layer 228 is formed to be connected to the clad layer 228' of the adjacent pixel.

A second planarization layer 235 may be formed on the second protective layer 234 to cover the entire surface of the base substrate 210 including the PIN diode 230.

The second planarization layer 235 may be formed of a layer made of organic material, which is much thicker than the inorganic material layer. Therefore, parasitic capacitance that may occur between electrodes or interconnects sandwiching the second planarization layer 235 may be minimized.

The second planarization layer 235 may have a planarized top face regardless of a shape of the underlying electrode or elements, thereby to minimize a curved portion. The second planarization layer 235 may be made of an organic material such as an acrylic resin such as photo acryl (PAC). However, the present disclosure is not limited thereto. A material such as PR (photo resist) may be used for the second planarization layer 235.

On the second planarization layer 235, a bias line 241 and a fifth electrode 236 may be formed. The fifth electrode 236 may be connected to the fourth electrode 233 via a fifth contact hole 234a formed in the second protective layer 234 and a sixth contact hole 235a formed in the second planarization layer 235.

The sixth contact hole 235a may be formed at the same position as the fifth contact hole 234a. The sixth contact hole 235a may be located outwardly of the fifth contact hole 234a such that the fifth contact hole 234a is exposed to an outside thereto. That is, the sixth contact hole 235a may be wider than the fifth contact hole 234a.

The fifth electrode 236 may be formed of a transparent oxide such as ITO (Indium Tin Oxide), IZO (Indium Zinc Oxide), or ZnO (Zinc Oxide) as in the fourth electrode 233, thereby minimizing the fill factor decrease of the PIN diode 230.

The fifth electrode 236 may electrically connect the fourth electrode 233 of the PIN diode 230 and the bias line 241, and thus may act as a kind of bridge wiring.

The bias line 241 may be formed between the second planarization layer 235 and the fifth electrode 236. Specifically, the bias line 241 may be formed beneath the fifth electrode 236 and may be in face-contact with the fifth electrode 236. The bias line 241 may be electrically connected to the fourth electrode 233 via the fifth electrode 236 to apply a bias voltage to the PIN diode 230.

In a case where the bias line 241 is formed to overlap the PIN diode 230, the fill factor of the diode 230 may be reduced due to partial overlapping between the bias line 241 and the light receiving region of the PIN diode 230. For this reason, the bias line 241 may be formed outside the PIN diode 230 so as not to overlap with the PIN diode 230.

In this case, the bias line 241 may be formed to overlap the data line 225 and extend along the data line 225. Specifically, the bias line 241 may be formed along the data line 225 so as not to reduce the fill factor of the PIN diode 230, and may be formed to overlap the data line 225. That is, the bias line 241 may be formed so as not to be wider than the data line 225 and may be formed to overlap the data line 225, so that the fill factor of the PIN diode 230 may not be reduced.

In the case where the bias line 241 is formed so as to overlap the data line 225, there may occur a problem of generation of the parasitic capacitance. In accordance with the present disclosure, however, the first planarization layer 226 and the second planarization layer 235 which are composed of organic material may be formed between the bias line 241 and the data line 225. Thus, although the bias line 241 and the data line 225 may be formed to overlap each other, the generation of the parasitic capacitance may be minimized.

Further, the bias line 241 may be formed to overlap the gate line 223 and along the gate line 223. The details of the case where the bias line 241 is formed so as to overlap the data line 225 as described above may be equally applied to the case when the bias line 241 is formed to overlap the gate line 223 and along the gate line 223.

A third protective layer 242 made of inorganic material may be formed on the fifth electrode 236 to cover the second planarization layer 235. When the active layer 221 of the thin-film transistor 220 is formed of an oxide semiconductor material, the third protective layer 242 preferably includes silicon oxide, but excludes silicon nitride.

However, when the active layer 221 is made of an amorphous silicon material, the active layer 221 may not be sensitive to the moisture. Thus, the third protective layer 242 may include silicon nitride as well as silicon oxide to further enhance the protective performance.

The third protective layer 242 made of inorganic material may facilitate adhesion between the planarization layers made of organic materials.

A third planarization layer 243 may be formed on the third protective layer 242. The third planarization layer 243 may have a planarized top face regardless of a shape of the underlying electrode or elements, thereby to minimize a curved portion. The third planarization layer 243 may be made of an organic material such as an acrylic resin such as photo acryl (PAC). However, the present disclosure is not limited thereto. A material such as PR (photo resist) may be used for the third planarization layer 243.

On the array substrate 201 according to the present disclosure, a scintillator layer 250 may be formed to cover the PIN diode 230. Since the scintillator layer 250 may be deposited directly on the array substrate 201, planarization of a top surface of the array substrate 201 is required. Thus, the third planarization layer 243 may be formed to planarize the top surface of the array substrate 201. This may facilitate the formation of the scintillator layer 250 on the third planarization layer 243 via deposition of the scintillator material.

The high-resolution digital X-ray detector 200 according to the present disclosure operates as follows.

The X-ray irradiated to the high-resolution digital X-ray detector 200 are converted to light of the visible-light region by the scintillator layer 250. The light of the visible-light region is converted to an electronic signal by the PIN layer 232 of the PIN diode 230.

Specifically, when light of the visible-light region is irradiated to the PIN layer 232, a I-type semiconductor layer is depleted by a P-type semiconductor layer and a N-type semiconductor layer, such that an electric field is generated therein. Then, holes and electrons generated by the light are drifted by the electric field and are collected into the P type semiconductor layer and the N type semiconductor layer, respectively.

The PIN diode 230 converts the light of the visible-light region into the electronic signal and transmits the signal to the thin-film transistor 220. The transmitted electronic signal passes along the data line 225 connected to the thin-film transistor 220 and then is displayed as a video signal.

Hereinafter, a process for manufacturing the digital X-ray detector 200 according to the present disclosure will be described in detail with reference to FIG. 9A to FIG. 9K.

A method of forming a pattern in each layer as described below may employ a photo lithography process including a deposition, a photoresist coating (PR) coating, an exposure, a development, an etching, and a photoresist (PR) strip. Detailed description thereof is omitted. For example, a deposition of a metallic material may employ sputtering. A deposition of a semiconductor or an insulating film may employ plasma enhanced chemical vapor deposition PECVD. In the etching, dry etching and wet etching may be selectively used depending on the material. A technique practiced by an ordinary artisan in the art may be applied to the etching.

Figure 9A:
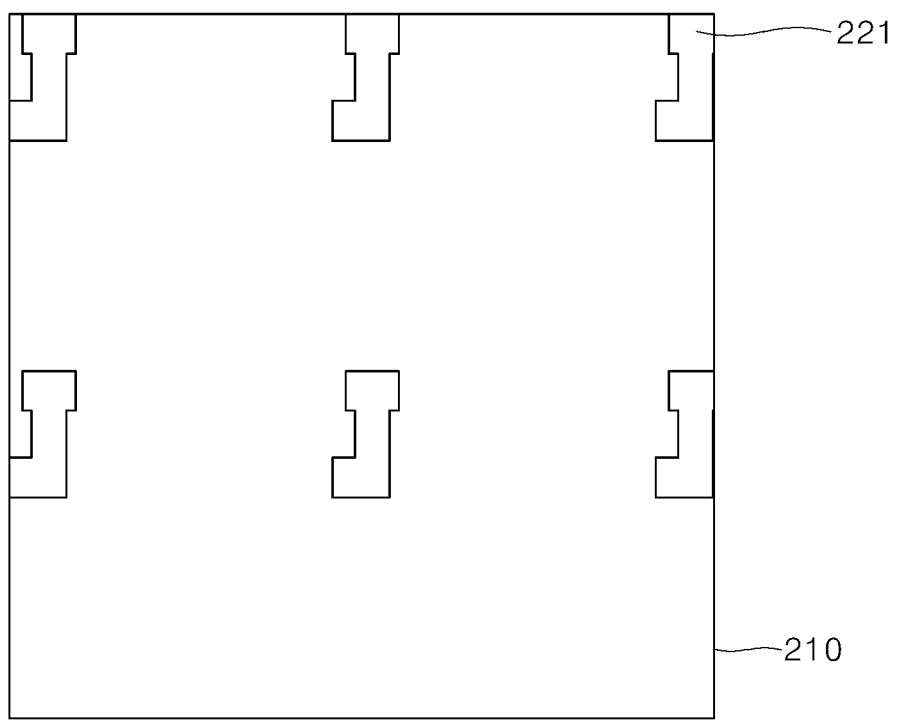
FIG. 9A to FIG. 9K are top views of partial regions of a thin-film transistor array substrate for a high-resolution digital X-ray detector during a process for manufacturing the thin-film transistor array substrate, according to one embodiment of the present disclosure.

First, as shown in FIG. 9A, the active layer 221 is formed on the base substrate 210. The gate insulating layer 222 is formed on the active layer 221.

Figure 9B:
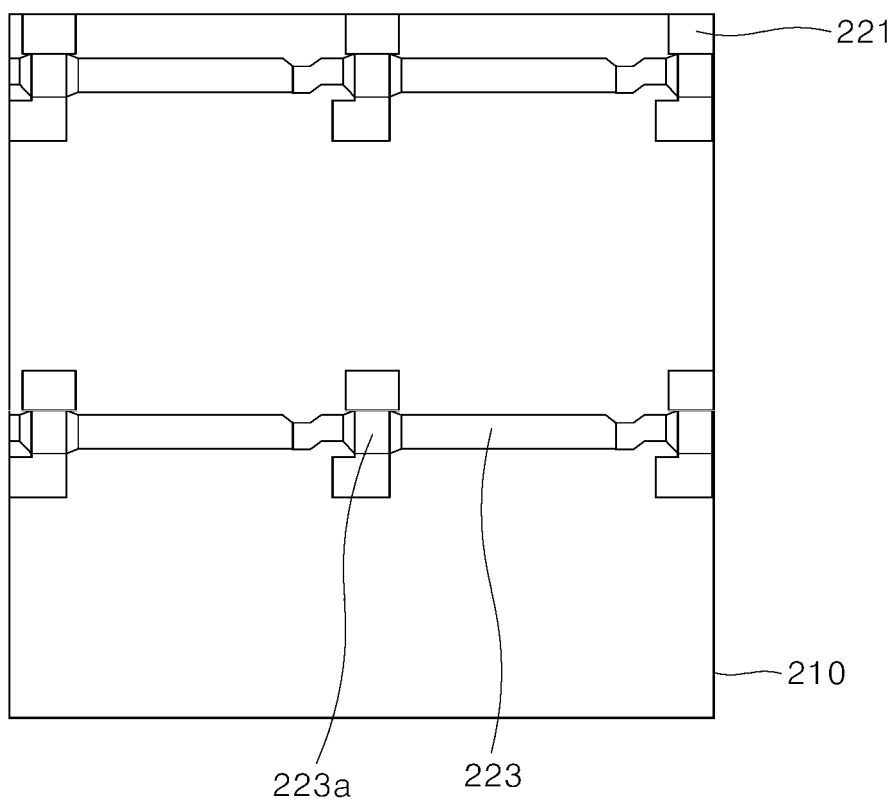

On the gate insulating layer 222, the plurality of gate lines 223 extending horizontally are formed as shown in FIG. 9B. The gate line 223 is formed to connect central portions of adjacent active layers 221 to each other. A portion of the gate line 223 overlapping with the active layer 221 may act as the gate electrode 223a of the thin-film transistor 220.

Figure 9C:
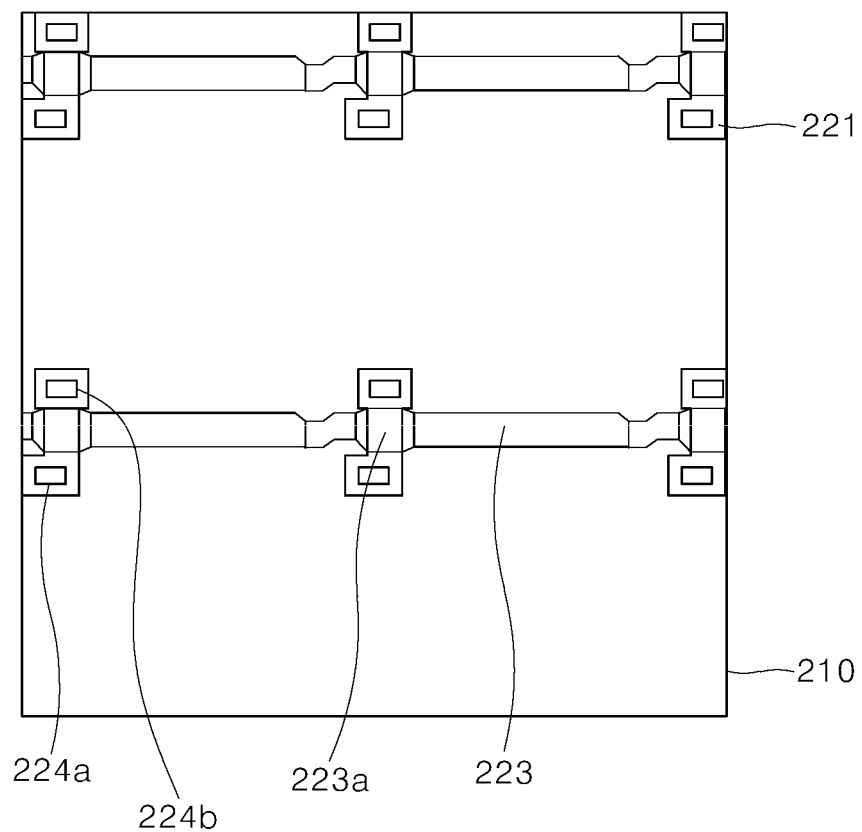

The inter-layer insulating layer 224 is formed on the gate electrode 223a. As shown in FIG. 9C, the first contact hole 224a and the second contact hole 224b are respectively formed in the drain region and source region of the active layer 221 in which the active layer 221 is not overlapped with the gate electrode 223a.

Figure 9D:
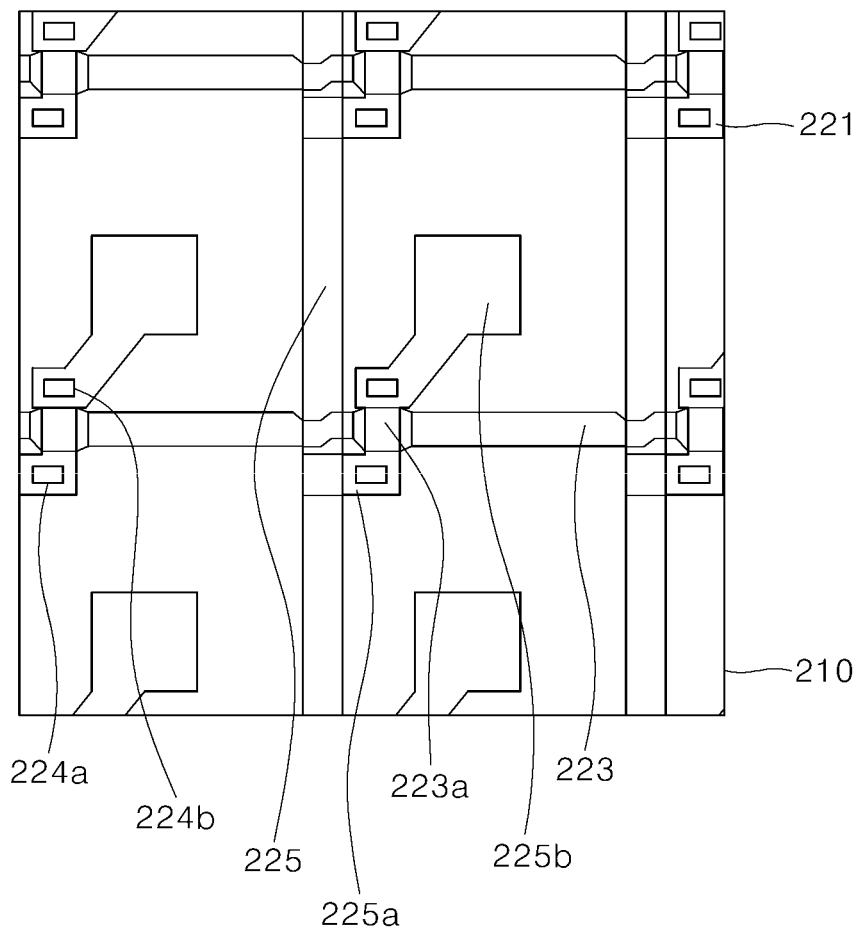

Next, as shown in FIG. 9D, the plurality of data lines 225 are formed to extend in a direction perpendicular to an extension direction of the plurality of gate lines 223 extending horizontally. The first electrode 225a and the second electrode 225b extend from the data line 225 and are connected to the active layer 221 via the first contact hole 224a and the second contact hole 224b, respectively. In this case, the second electrode 225b extends from the data line 225 beyond the active layer 221 so as to be located inside the cell region formed by the intersection of the gate line 223 and the data line 225. Thus, the second electrode 225b has a large area.

Figure 9E:
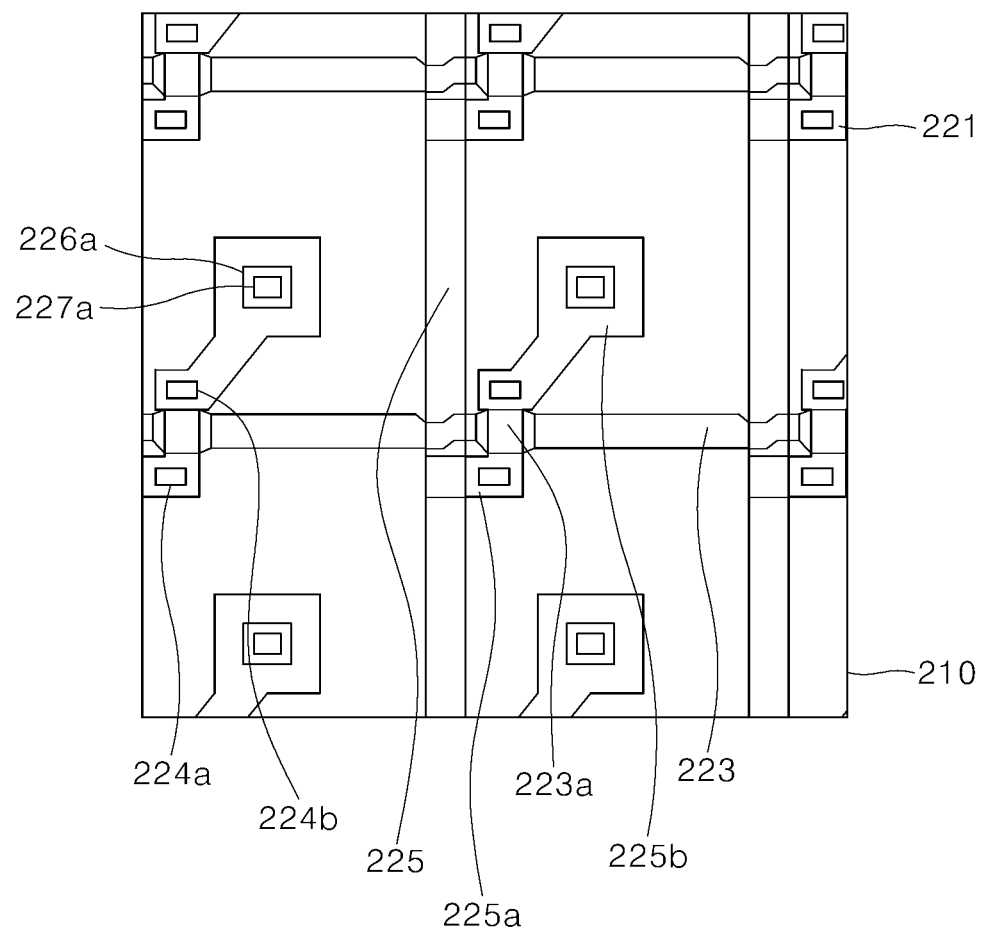

The first planarization layer 226 and the first protective layer 227 are formed on the entire surface of the base substrate 210. As shown in FIG. 9E, the third contact hole 226a and the fourth contact hole 227a are respectively formed in the first planarization layer 226 and the first protective layer 227 in a location corresponding to a location the second electrode 225b located in the cell region. The fourth contact hole 227a is formed at the same position as the third contact hole 226a. The fourth contact hole 227a is formed inside the third contact hole 226a and has a contact hole area smaller than that of the third contact hole 226a.

Figure 9F:
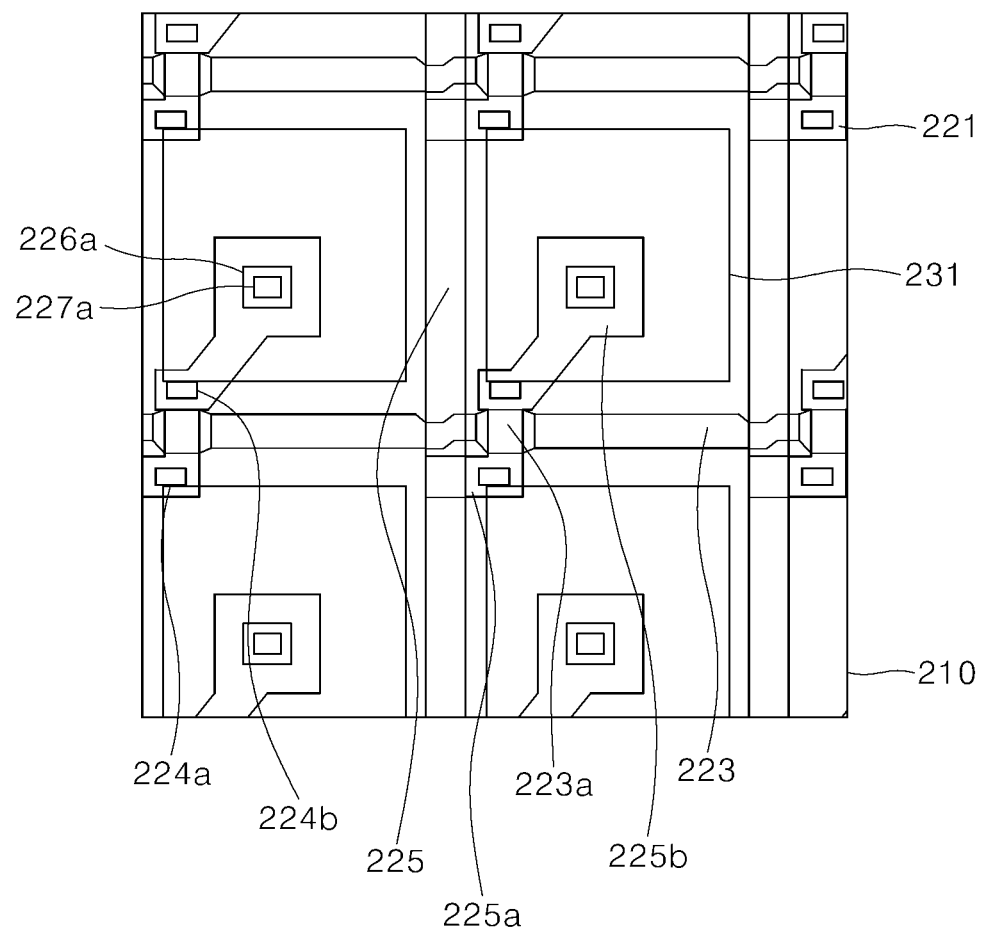

On the first planarization layer 226 and the first protective layer 227, the third electrode 231 as a pixel electrode of the PIN diode 230 is formed as shown in FIG. 9F. The third electrode 231 has a shape conformal to a shape of the cell region. The third electrode 231 has a predetermined spacing from the gate line and the data line so as to be spaced apart from a third electrode 231' of an adjacent pixel by a predetermined distance.

Figure 9G:
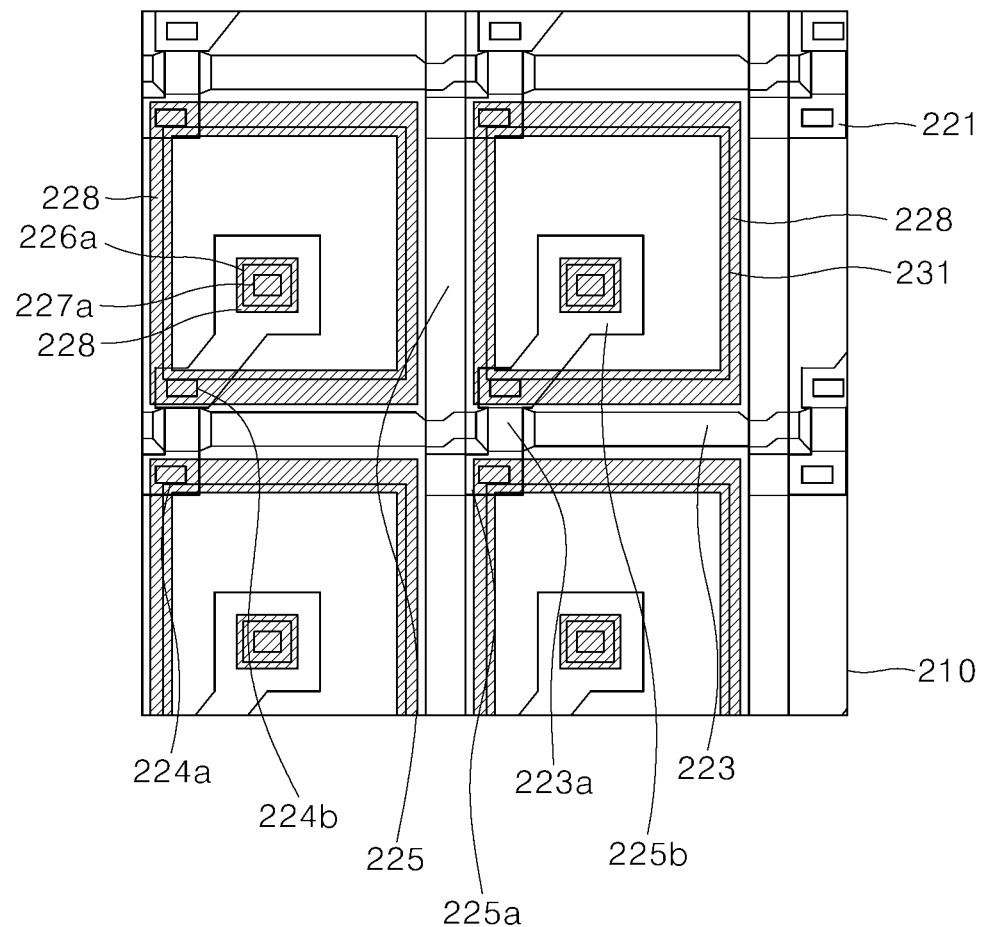

On the third electrode 231, the clad layer 228 is formed to cover the contact hole region of the third electrode 231 corresponding to the third contact hole 226a and the edge region of the third electrode 231 except the planarized top surface of the third electrode 231 as shown in FIG. 9G. The clad layer 228 may be located only within the cell region, and may be formed to cover the entire surface of the base substrate except for the planarized top surface of the third electrode 231.

Figure 9H:
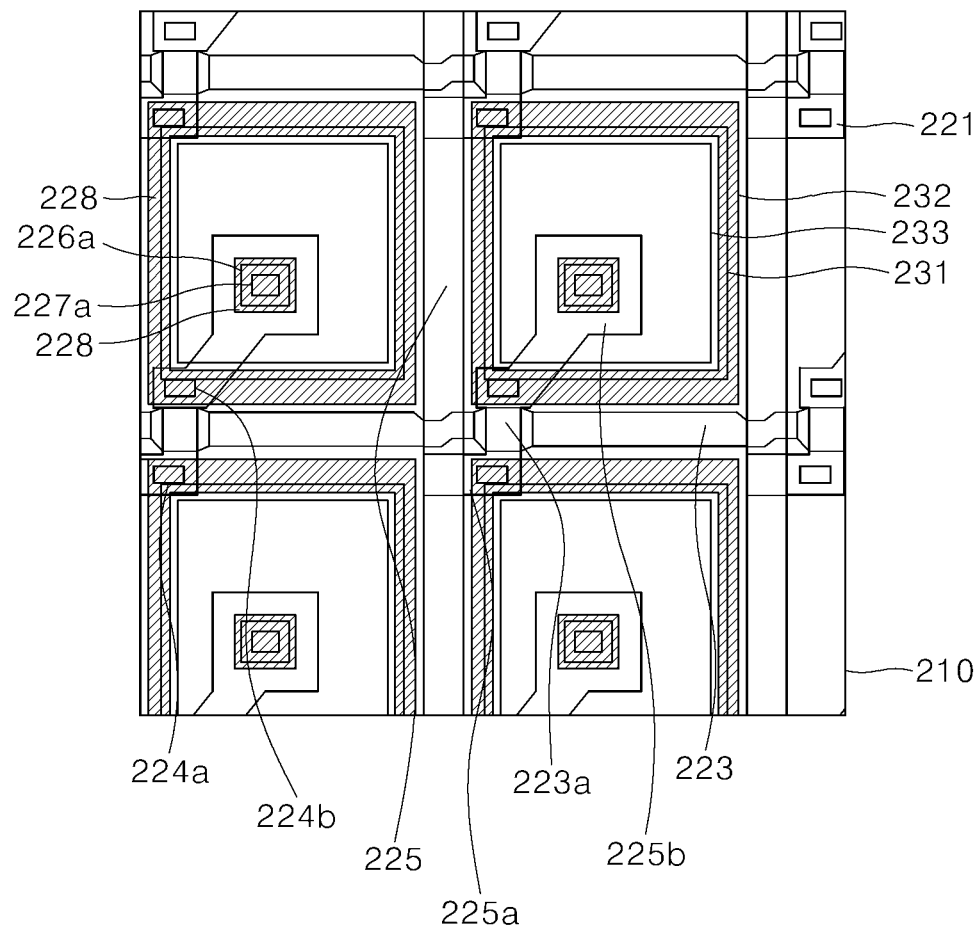

On the third electrode 231 and the clad layer 228, the PIN layer 232 of the PIN diode 230 may be formed as shown in FIG. 9H. The PIN layer 232 covers an entirety of the third electrode 231. In order to maximize the fill factor, the PIN layer 232 may be formed to cover the entire cell region. The fourth electrode 233 may be formed on the PIN layer 232. The fourth electrode 233 is formed to have a predetermined spacing from the gate line and the data line so as to be spaced apart from another fourth electrode 233' of the adjacent pixel by a predetermined distance.

Figure 9I:
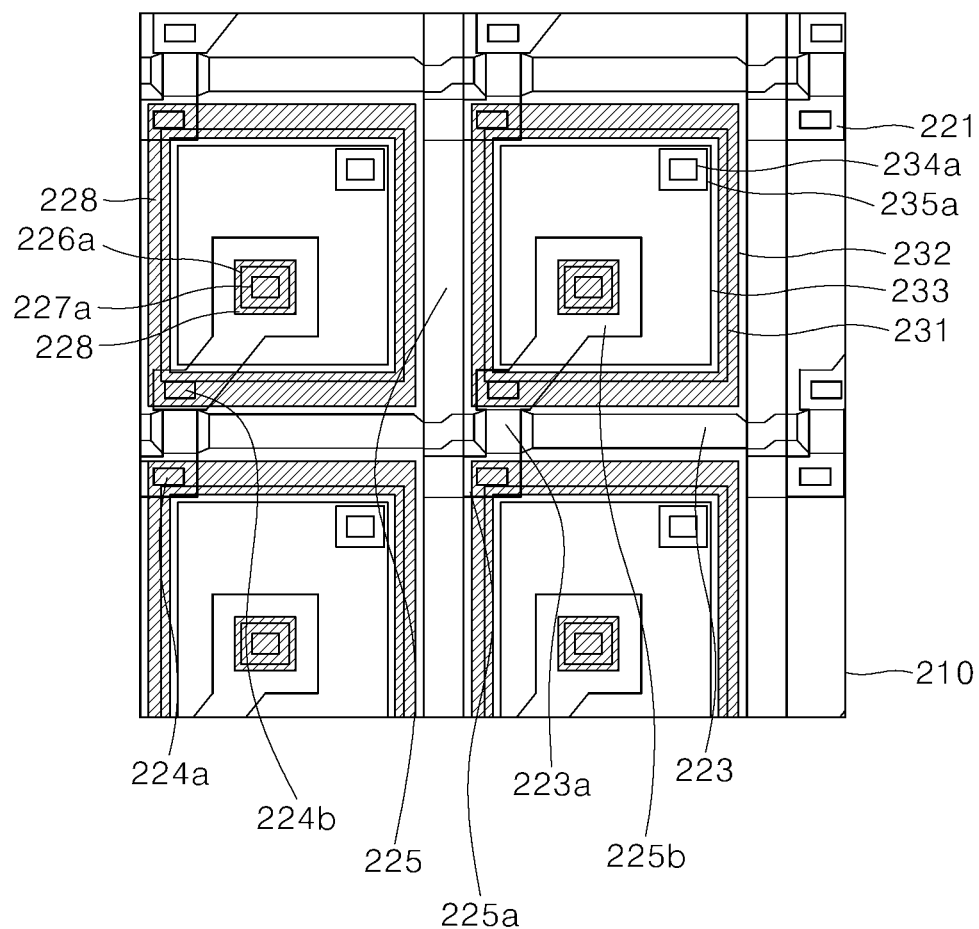

The second protective layer 234 and the second planarization layer 235 are formed on the PIN diode 230. As shown in FIG. 9I, the fifth contact hole 234a and the sixth contact hole 235a are formed in the second protective layer 234 and the second planarization layer 235, respectively in a location corresponding to the fourth electrode 233. The sixth contact hole 235a is formed at the same position as the fifth contact hole 234a. The sixth contact hole 235a is formed outside the fifth contact hole 234a so as to have a contact hole area larger than that of the fifth contact hole 234a.

Figure 9J:
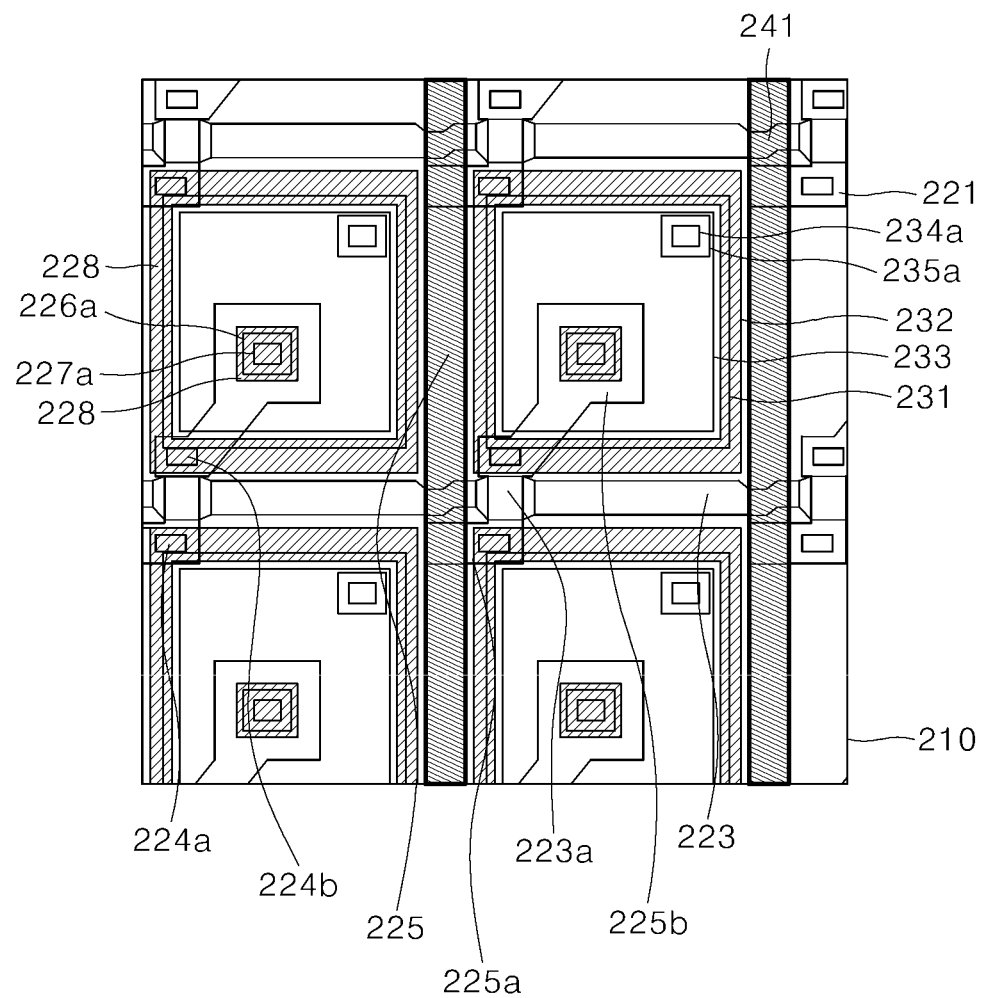
Figure 9K:
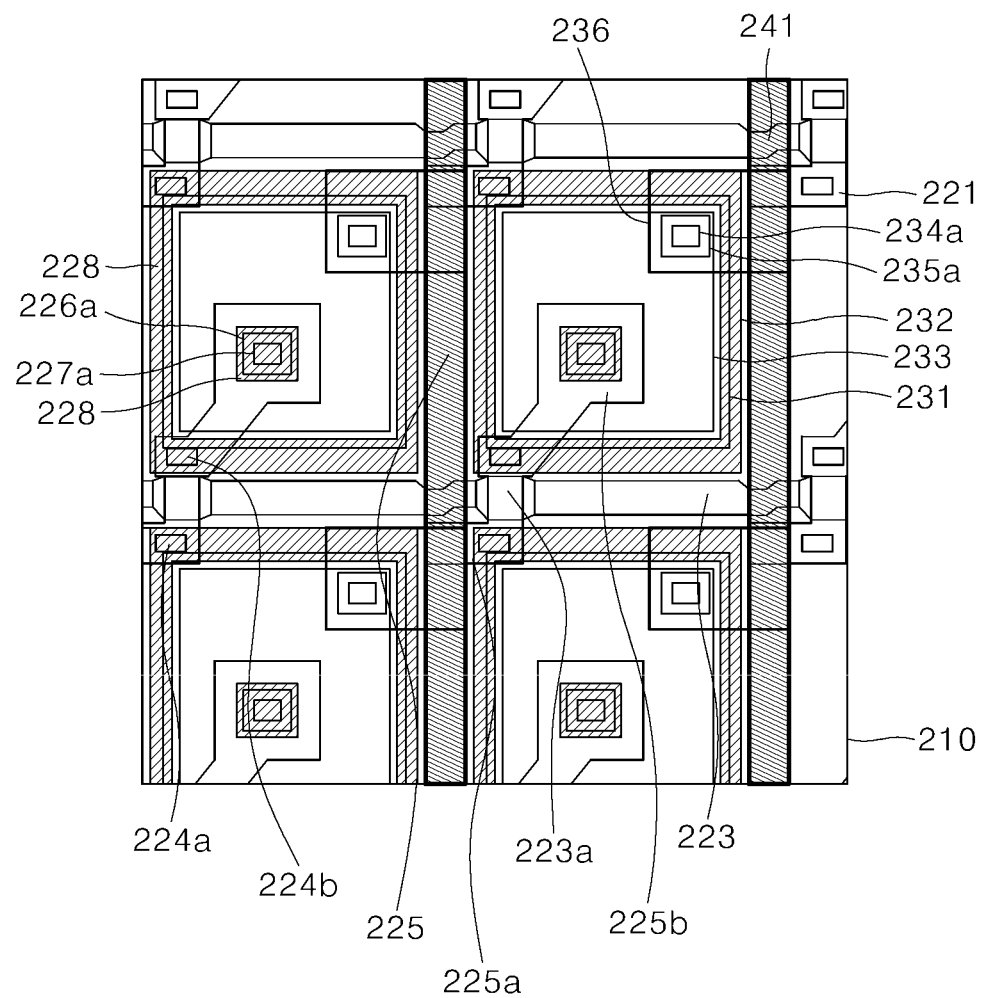

The bias line 241 is formed to overlap the data line 225 and along the data line 225, as shown in FIG. 9J. A portion of the fifth electrode 236 is connected to the fourth electrode 233 via the fifth contact hole 234a and the sixth contact hole 235a, while another portion of the fifth electrode 236 covers and contacts the bias line 241 as shown in FIG. 9K. Thus, the fifth electrode 236 connects the fourth electrode 233 to the bias line 241 to apply a bias voltage to the PIN diode 230.

On the fifth electrode 236, the third protective layer 242 and the third planarization layer 243 may be formed. On the third planarization layer 243, the scintillator layer 250 may be formed by deposition.

The present disclosure is described with reference to the drawings and embodiments. However, the present disclosure is not limited to the embodiments and drawings disclosed herein. It will be apparent that various modifications may be made thereto by those skilled in the art within the scope of the present disclosure. Furthermore, although the effects resulting from the configurations of the present disclosure have not been explicitly in describing the effect resulting from the configurations of the present disclosure, the effects expected from the configurations of the present disclosure should be recognized.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A thin-film transistor array substrate for a digital X-ray detector, the thin-film transistor array substrate comprising:
   a base substrate;
   a thin-film transistor on the base substrate, the thin-film transistor including an active layer, a gate electrode, and a first electrode and second electrode connected to the active layer;
   a first planarization layer on the thin-film transistor; and
   a PIN (P type semiconductor-Intrinsic type semiconductor-N type semiconductor) diode on the first planarization layer, wherein the PIN diode includes a third electrode connected to the thin-film transistor, a PIN layer on the third electrode, and a fourth electrode on the PIN layer, the third electrode inside the PIN layer, and a clad layer of inorganic material between the third electrode and the PIN layer in an edge region of the third electrode to surround the edge region.

2. The thin-film transistor array substrate of claim 1, wherein the clad layer has a hollow portion defined therein.

3. The thin-film transistor array substrate of claim 1, wherein the second electrode and the third electrode are connected to each other via a contact hole formed in the first planarization layer,
   wherein the contact hole is inside the PIN diode, and
   wherein the clad layer further covers a contact hole region of the third electrode corresponding to the contact hole.

4. The thin-film transistor array substrate of claim 3, wherein a portion of a top surface of the third electrode free of the clad layer is planarized.

5. The thin-film transistor array substrate of claim 1, wherein the clad layer is inside the PIN diode.

6. The thin-film transistor array substrate of claim 1, wherein the clad layer is inside and outside the PIN diode.

7. The thin-film transistor array substrate of claim 6, wherein the clad layer is connected to a clad layer of an adjacent PIN diode.

8. The thin-film transistor array substrate of claim 6, wherein a portion of the clad layer outside the PIN diode is thinner than a portion of the clad layer inside the PIN diode.

9. The thin-film transistor array substrate of claim 1, wherein the clad layer covers a sloped side surface of the third electrode.

10. The thin-film transistor array substrate of claim 1, wherein the clad layer covers a top surface of the third electrode by 3 µm or greater from an edge of the top surface of the third electrode.

11. The thin-film transistor array substrate of claim 1, wherein a first protective layer is between the first planarization layer and the PIN diode.

12. The thin-film transistor array substrate of claim 11, wherein the first planarization layer is made of an organic material, and the first protective layer is made of an inorganic material.

13. The thin-film transistor array substrate of claim 1, wherein a second planarization layer is on the fourth electrode, wherein a fifth electrode is on the second planarization layer, wherein the fifth electrode is connected to the fourth electrode via a contact hole defined in the second planarization layer.

14. The thin-film transistor array substrate of claim 13, wherein a second protective layer is between the second planarization layer and the PIN diode.

15. The thin-film transistor array substrate of claim 14, wherein the second protective layer covers the PIN diode.

16. The thin-film transistor array substrate of claim 14, wherein the second protective layer covers an entire surface of the base substrate.

17. The thin-film transistor array substrate of claim 14, wherein the second planarization layer is made of an organic material, and the second protective layer is made of an inorganic material.

18. A digital X-ray detector, comprising:
a thin-film transistor array substrate including:
  a base substrate;
  a thin-film transistor overlying the base substrate, the thin-film transistor including an active layer, a gate electrode, a first electrode connected to the active layer and a second electrode connected to the active layer;
  a first planarization layer on the thin-film transistor; and
  a PIN (P type semiconductor-Intrinsic type semiconductor-N type semiconductor) diode on the first planarization layer, the PIN diode including a third electrode connected to the thin-film transistor, a PIN layer on the third electrode, and a fourth electrode on the PIN layer, the third electrode being inside the PIN layer and a clad layer of inorganic material being between the third electrode and the PIN layer in an edge region of the third electrode, the clad layer surrounding the edge region; and
a scintillator layer on the thin-film transistor array substrate.

19. The digital X-ray detector of claim 18, wherein the first planarization layer includes a contact hole, the second electrode and the third electrode connected to each through the contact hole and the contact hole being inside the PIN diode, the clad layer further covering a contact hole region of the third electrode overlying the contact hole.

20. A method, comprising:
forming a thin-film transistor overlying a base substrate, the thin-film transistor including an active layer and a transistor electrode connected to the active layer;
forming a first planarization layer on the thin-film transistor;
forming a contact hole in the first planarization layer over the transistor electrode;
forming a first electrode of a PIN (P type semiconductor-Intrinsic type semiconductor-N type semiconductor) diode in the contact hole and on the first planarization layer over the transistor electrode, the first electrode of the PIN diode including an edge region;
forming a PIN layer completely covering the first electrode of the PIN diode so an entirety of the first electrode of the PIN diode is below the PIN layer;
forming a second electrode of the PIN diode on the PIN layer; and
forming a clad layer of inorganic material surrounding the edge region of the first electrode of the PIN diode, the clad layer being between the edge region of the first electrode of the PIN diode and the PIN layer.

21. The method of claim 20, further comprising forming a scintillator layer on the base substrate.

22. The method of claim 20, further comprising:
forming a contact hole in the first planarization layer over the transistor electrode;
forming a contact hole region of the first electrode of the PIN diode corresponding to the contact hole in the first planarization layer; and
forming the clad layer in the contact hole region of the first electrode of the PIN diode.

* * * * *